US012652913B2

(12) United States Patent
Feng et al.

(10) Patent No.: US 12,652,913 B2
(45) Date of Patent: Jun. 9, 2026

(54) DISPLAY PANEL AND DISPLAY APPARATUS

(71) Applicants: Hefei BOE Joint Technology Co., Ltd., Hefei (CN); BOE Technology Group Co., Ltd., Beijing (CN)

(72) Inventors: Xuehuan Feng, Beijing (CN); Yubao Kong, Beijing (CN); Hao Liu, Beijing (CN); Shi Sun, Beijing (CN)

(73) Assignees: Hefel BOE Joint Technology Co., Ltd., Hefei (CN); BOE Technology Group Co., Ltd., Beijing (CN)

( * ) Notice: Subject to any disclaimer, the term of this patent is extended or adjusted under 35 U.S.C. 154(b) by 470 days.

(21) Appl. No.: 18/279,392

(22) PCT Filed: Nov. 24, 2022

(86) PCT No.: PCT/CN2022/133934
§ 371 (c)(1),
(2) Date: Aug. 30, 2023

(87) PCT Pub. No.: WO2024/108471
PCT Pub. Date: May 30, 2024

(65) Prior Publication Data
US 2025/0089485 A1     Mar. 13, 2025

(51) Int. Cl.
*H10K 59/131*     (2023.01)
*G09G 3/32*     (2016.01)
*H10K 59/88*     (2023.01)

(52) U.S. Cl.
CPC ........... *H10K 59/131* (2023.02); *H10K 59/88* (2023.02)

(58) Field of Classification Search
CPC ...... H10K 59/131; H10K 59/88; H10K 59/12; G09G 3/3233; H10D 89/00
See application file for complete search history.

(56) References Cited

U.S. PATENT DOCUMENTS

| | | | |
|---|---|---|---|
| 2017/0110478 A1 | 4/2017 | Gai et al. | |
| 2018/0107041 A1 | 4/2018 | Hayashi | |
| 2018/0233498 A1 | 8/2018 | Xu et al. | |
| 2019/0067409 A1 | 2/2019 | Shin et al. | |

(Continued)

FOREIGN PATENT DOCUMENTS

| | | |
|---|---|---|
| CN | 101847628 A | 9/2010 |
| CN | 101990358 A | 3/2011 |

(Continued)

*Primary Examiner* — Pegeman Karimi
(74) *Attorney, Agent, or Firm* — Ling Wu; Stephen Yang; Ling and Yang Intellectual Property

(57) ABSTRACT

Provided are a display panel and a display apparatus, the display panel includes a substrate and a drive circuit layer, wherein the drive circuit layer includes a pixel circuit (P) arranged in an array, a plurality of first scan signal lines (G1) and a plurality of second scan signal lines (G2). The drive circuit layer includes a plurality of first discharge structures (E1) and/or a plurality of second discharge structures (E2). At least one first discharge structure (E1) is electrically connected to a first scan signal line (G1) and a second scan signal line (G2) respectively, and the first scan signal line (G1) and the second scan signal line (G2) electrically connected to the first discharge structure (E1) are electrically connected to the same row of pixel circuit.

20 Claims, 23 Drawing Sheets

(56) References Cited

U.S. PATENT DOCUMENTS

| | | | |
|---|---|---|---|
| 2022/0310010 A1* | 9/2022 | Cheng ................. | G09G 3/3266 |
| 2023/0110320 A1* | 4/2023 | Shin ..................... | G09G 3/3266 |
| | | | 345/691 |
| 2023/0215335 A1* | 7/2023 | Park ..................... | G09G 3/2096 |
| | | | 345/214 |
| 2023/0275099 A1* | 8/2023 | No ...................... | G09G 3/3233 |
| | | | 257/72 |

FOREIGN PATENT DOCUMENTS

| | | | |
|---|---|---|---|
| CN | 102904115 A | 1/2013 | |
| CN | 103928456 A | 7/2014 | |
| CN | 105304645 A | 2/2016 | |
| CN | 105487317 A | 4/2016 | |
| CN | 109428000 A | 3/2019 | |
| CN | 112885302 A | 6/2021 | |
| CN | 113327556 A | 8/2021 | |

* cited by examiner

ET1

ET2/EC11/EC22

ESDL/ET4/EC22

Data/ET3/EC12

DISPLAY PANEL AND DISPLAY APPARATUS

CROSS-REFERENCE TO RELATED APPLICATION

The present application is a U.S. National Phase Entry of International Application No. PCT/CN2022/133934 having an international filing date of Nov. 24, 2022. The above-identified application is hereby incorporated by reference.

TECHNICAL FIELD

The present disclosure relates to, but is not limited to, the field of display technologies, and more particularly, to a display panel and a display apparatus.

BACKGROUND

An Organic Light Emitting Diode (OLED for short) and a Quantum dot Light Emitting Diode (QLED for short) are active light emitting display devices and have advantages such as self-luminescence, a wide viewing angle, a high contrast ratio, low power consumption, an extremely high response speed, lightness and thinness, flexibility, and a low cost. With constant development of display technologies, a flexible display apparatus (Flexible Display) in which an OLED or a QLED is used as a light emitting device and signal control is performed through a Thin Film Transistor (TFT for short) has become a mainstream product in the field of display at present.

SUMMARY

The following is a summary of the subject matter described in detail in the present application. The summary is not intended to limit the protection scope of claims.

In a first aspect, the present disclosure provides a display panel including: a substrate and a drive circuit layer disposed on the substrate, the substrate includes: a display region and a non-display region, the drive circuit layer includes: pixel circuits located in the display region and arranged in an array, a plurality of first scan signal lines and a plurality of second scan signal lines located at least partially in the display region, at least one pixel circuit is electrically connected to the first scan signal lines and the second scan signal lines respectively, the first scan signal lines and the second scan signal lines electrically connected to the pixel circuits are respectively located on both sides of the pixel circuits and extending at least partially in a first direction;

the drive circuit layer includes a plurality of first discharge structures and/or a plurality of second discharge structures, at least one first discharge structure is electrically connected to the first scan signal line and the second scan signal line respectively, the first scan signal line and the second scan signal line electrically connected to the first discharge structure are connected to the same row of pixel circuits, at least one second discharge structure is electrically connected to the first scan signal line and the second scan signal line respectively, the first scan signal line and the second scan signal line electrically connected to the second discharge structure are connected to adjacent row of pixel circuits and are located between the adjacent row of pixel circuits.

In an exemplary embodiment, the drive circuit layer further includes: a gate drive circuit located in a non-display region, a first low-level power line and a second low-level power line extending along a second direction, and a plurality of first scan output lines and a plurality of second scan output lines extending at least partially along the first direction, the first direction intersects the second direction, the first low-level power line and the second low-level power line are disposed on the same layer, the first scan output line and the second scan output line are disposed on the same layer, the first low-level power line is located on a side of the first scan output line close to the substrate; the first scan output line is electrically connected to the first scan signal line, the second scan output line is electrically connected to the second scan signal line, and the gate drive circuit is electrically connected to the first low-level power line, the second low-level power line, a plurality of first scan output lines and a plurality of second scan output lines, respectively; the first low-level power line and the second low-level power line are located on a side of the gate drive circuit close to the display region, and the first low-level power line is located on a side of the second low-level power line away from the display region.

In an exemplary embodiment, the drive circuit layer further includes: a plurality of data signal lines at least partially located in the display region, and a plurality of electrostatic discharge circuits and a plurality of electrostatic discharge lines located in the non-display region, the data signal lines and the electrostatic discharge lines at least partially extend in a second direction, and the data signal lines and the electrostatic discharge lines are disposed in the same layer as the electrostatic discharge lines; the pixel circuit is electrically connected to the data signal line, and at least one electrostatic discharge circuit is electrically connected to the data signal line and the electrostatic discharge line, respectively.

In an exemplary embodiment, the drive circuit layer further includes: a first power line located at least partially in the display region, and a first power supply wire located in the non-display region, a second power line and a second power supply wire, the first power supply wire supplies a high-level signal, and the second power supply wire supplies a low-level signal; the first power supply wire and the second power supply wire are disposed in the same layer, the first power line is located on a side of the first power supply wire away from the substrate, the second power line is located on a side of the second power supply wire close to the substrate, the first power supply wire is located on a side of the second power line away from the display region, and the second power line partially surrounds the first power supply wire, the second power supply wire is disposed on a side of the first power supply wire away from the display region and surrounds at least one side of the display region; the pixel circuit is electrically connected to the first power line, an orthographic projection of the first power supply wire on the substrate partially overlaps orthographic projection portions of the first power line and the second power line on the substrate and the first power supply wire is electrically connected to the first power line, an orthographic projection of the second power line on the substrate partially overlaps orthographic projections of the plurality of electrostatic discharge lines and the first power line on the substrate and the second power line is electrically connected to the plurality of electrostatic discharge lines and the second power supply wire, respectively.

In an exemplary embodiment, the drive circuit layer further includes: a first signal connection line and a second signal connection line, the first signal connection line and the second signal connection line at least partially extend in a first direction, and the first signal connection line and the second signal connection line are electrically connected to different electrostatic discharge circuits, respectively; the pixel circuit includes a first pixel circuit and a second pixel circuit, wherein the second pixel circuit is located on a side of the first pixel circuit close to a second power supply wire; an orthographic projection of a first scan signal line electrically connected to the first pixel circuit on the substrate partially overlaps an orthographic projection of the first scan output line on the substrate and the first scan signal line is electrically connected to the first scan output line, and an orthographic projection of a second scan signal line electrically connected to the first pixel circuit on the substrate partially overlaps an orthographic projection of the second scan output line on the substrate and the second scan signal line is electrically connected to the second scan output line; an orthographic projection of a second scan signal line electrically connected to the second pixel circuit on the substrate partially overlaps an orthographic projection of the first signal connection line on the substrate and the second scan signal line is electrically connected to the first signal connection line, and an orthographic projection of the first scan signal line electrically connected to the second pixel circuit on the substrate partially overlaps an orthographic projection of the second signal connection line on the substrate and the first scan signal line is electrically connected to the second signal connection line.

In an exemplary embodiment, the drive circuit layer further includes a plurality of first low-level connection portions arranged at intervals and a plurality of second low-level connection portions arranged at intervals, the first low-level connection portions and the second low-level connection portions are disposed in the same layer, and the first low-level connection portions are located on a side of the first low-level power line away from the substrate.

In an exemplary embodiment, when the display panel includes a first discharge structure, the first scan signal line is provided with a first protrusion extending in a second direction, the first protrusion is located on a side of the first scan signal line close to an electrically connected pixel circuit, and the first protrusion includes a first tip; the second scan signal line is provided with a second protrusion extending in a second direction, the second protrusion is located on a side of the second scan signal line close to an electrically connected pixel circuit, and the second protrusion includes a second tip; the first tip of the first scan signal line electrically connected to the first discharge structure is disposed opposite to the second tip of the second scan signal line electrically connected to the first discharge structure, and an orthographic projection of the first discharge structure on the substrate at least partially overlaps an orthographic projection of the first tip of the first scan signal line electrically connected to the first discharge structure on the substrate and an orthographic projection of the second tip of the second scan signal line electrically connected to the first discharge structure on the substrate, respectively.

In an exemplary embodiment, when the display panel includes a second discharge structure, the first scan signal line is provided with a third protrusion extending at least partially in a second direction, the third protrusion is located on a side of the first scan signal line close to the gate drive circuit, and the third protrusion includes a third tip; the second scan signal line is further provided with a fourth protrusion extending at least partially in the second direction, the fourth protrusion is located on a side of the second scan signal line close to the gate drive circuit, and the fourth protrusion includes a fourth tip; the third tip of the first scan signal line electrically connected to the second discharge structure is disposed opposite to the fourth tip of the second scan signal line electrically connected to the second discharge structure, and an orthographic projection of the second discharge structure on the substrate at least partially overlaps an orthographic projection of the third tip of the electrically connected first scan signal line on the substrate and an orthographic projection of the fourth tip of the electrically connected second scan signal line on the substrate, respectively.

In an exemplary embodiment, when the display panel includes a second discharge structure, the second discharge structure is electrically connected to the first scan signal line through a first signal line, and is electrically connected to the second scan signal line through a second scan output line; the first signal line includes a first scan output line or a second signal connection line, when the pixel circuit electrically connected to the first scan signal line is a first pixel circuit, the first signal line is the first scan output line, and when the pixel circuit electrically connected to the first scan signal line is a second pixel circuit, the first signal line is the second signal connection line.

In an exemplary embodiment, the first signal line electrically connected to the second discharge structure is provided with a fifth protrusion extending at least partially in a second direction, the fifth protrusion is located on a side of the first signal line close to the gate drive circuit, and the fifth protrusion includes a fifth tip; the second scan output line electrically connected to the second scan signal line is provided with a sixth protrusion extending at least partially in the second direction, the sixth protrusion is located on a side of the second scan output line close to the gate drive circuit, and the sixth protrusion includes a sixth tip; a fifth tip of the first signal line electrically connected to the second discharge structure is disposed opposite to a sixth tip of the second scan output line electrically connected to the second discharge structure, and an orthographic projection of the second discharge structure on the substrate at least partially overlaps an orthographic projection of the fifth tip of the electrically connected first signal line on the substrate and an orthographic projection of the sixth tip of the electrically connected second scan output line on the substrate, respectively.

In an exemplary embodiment, the second discharge structure is also electrically connected to a second low-level power line or a second low-level connection portion.

In an exemplary embodiment, when the second discharge structure is electrically connected to a second low-level power line, the second low-level power line is provided with a seventh protrusion extending in a first direction, and the seventh protrusion includes a seventh tip; a dummy line passing through the seventh tip and extending in the first direction is located between the other two tips at least partially overlapping the second discharge structure on the substrate; an orthographic projection of the second discharge structure on the substrate also partially overlaps an orthographic projection of a seventh tip of the electrically connected second low-level power line on the substrate.

In an exemplary embodiment, when the second discharge structure is electrically connected to a second low-level connection portion, the second low-level connection portion is provided with an eighth protrusion extending in a first direction, and the eighth protrusion portion includes an eighth tip; a dummy line passing through the eighth tip and extending in the first direction is located between the other two tips at least partially overlapping the second discharge structure on the substrate; an orthographic projection of the second discharge structure on the substrate also partially overlaps an orthographic projection of the eighth tip of the electrically connected second low-level connection portion on the substrate.

In an exemplary embodiment, the drive circuit layer further includes: at least one of a third discharge structure, a fourth discharge structure, a fifth discharge structure, and a sixth discharge structure; the third discharge structure is electrically connected to a scan signal line close to a non-display region and an electrostatic discharge line close to a gate drive circuit, respectively, the fourth discharge structure is electrically connected to a second low-level power line and an electrostatic discharge line close to a gate drive circuit, respectively, the fifth discharge structure is electrically connected to a first low-level power line and a second low-level power line, respectively, and the sixth discharge structure is electrically connected to a first power supply wire and a second power supply wire, respectively, and the scan signal line is a first scan signal line or a second scan signal line.

In an exemplary embodiment, the first discharge structure, the second discharge structure, the third discharge structure, the fourth discharge structure, the fifth discharge structure, and the sixth discharge structure are disposed on the same layer.

In an exemplary embodiment, when the drive circuit layer includes a third discharge structure or a fourth discharge structure, the electrostatic discharge line close to the gate drive circuit includes a first connection line extending in a first direction and a second connection line extending in a second direction, and the first connection line is electrically connected to the second connection line.

In an exemplary embodiment, the scan signal line electrically connected to the third discharge structure is provided with a ninth protrusion extending in a second direction, the ninth protrusion is located on a side of the scan signal line close to the electrostatic discharge circuit, and the ninth protrusion includes a ninth tip; the first connection line of the electrostatic discharge line electrically connected to the third discharge structure is provided with a tenth protrusion, the tenth protrusion is located on a side of the first connection line close to the electrostatic discharge circuit, and the tenth protrusion includes a tenth tip; a ninth tip of a scan signal line electrically connected to the third discharge structure and a tenth tip of an electrostatic discharge line electrically connected to the third discharge structure are disposed opposite to each other, an orthographic projection of the third discharge structure on the substrate at least partially overlaps with an orthographic projection of a ninth tip of an electrically connected scan signal line and a tenth tip of an electrostatic discharge line electrically connected to the third discharge structure on the substrate.

In an exemplary embodiment, the third discharge structure is electrically connected to a scan signal line through a first signal connection line.

In an exemplary embodiment, the first signal connection line electrically connected to the third discharge structure is provided with an eleventh protrusion extending in a second direction, the eleventh protrusion is located on a side of the first signal connection line close to the electrostatic discharge circuit, and the eleventh protrusion includes an eleventh tip; the first connection line of the electrostatic discharge line electrically connected to the third discharge structure is provided with a tenth protrusion, the tenth protrusion is located on a side of the first connection line of the electrostatic discharge line close to the electrostatic discharge circuit, and the tenth protrusion includes a tenth tip; an eleventh tip of a first signal connection line electrically connected to the third discharge structure and a tenth tip of an electrostatic discharge line electrically connected to the third discharge structure are disposed opposite to each other, an orthographic projection of the third discharge structure on the substrate at least partially overlaps with an orthographic projection of an eleventh tip of an electrically connected first signal connection line and a tenth tip of an electrically connected electrostatic discharge line on the substrate.

In an exemplary embodiment, the electrostatic discharge line electrically connected to the fourth discharge structure includes a twelfth protrusion located on a side of a first connection line of the electrostatic discharge line close to the gate drive circuit, and the twelfth protrusion includes a twelfth tip; the second low-level power line is further provided with a thirteenth protrusion extending in the first direction, the thirteenth protrusion is located on a side of the second low-level power line close to the display region, and the thirteenth protrusion includes a thirteenth tip; the twelfth tip of the electrostatic discharge line electrically connected to the fourth discharge structure is disposed opposite to the thirteenth tip of the second low-level power line; an orthographic projection of the fourth discharge structure on the substrate at least partially overlaps with an orthographic projection of a twelfth tip of an electrically connected electrostatic discharge line on the substrate and an orthographic projection of a thirteenth tip of a second low-level power line on the substrate.

In an exemplary embodiment, the first low-level power line is provided with a fourteenth protrusion located on a side of the first low-level power line close to the second power supply wire, and the fourteenth protrusion includes a fourteenth tip; the second low-level power line is provided with a fifteenth protrusion, the fifteenth protrusion is located on a side of the second low-level power line close to the second power supply wire, and the fifteenth protrusion includes a fifteenth tip; the fourteenth tip of the first low-level power line is disposed opposite to the fifteenth tip of the second low-level power line; an orthographic projection of the fifth discharge structure on the substrate at least partially overlaps with an orthographic projection of the fourteenth tip of the first low-level power line on the substrate and an orthographic projection of the fifteenth tip of the second low-level power line on the substrate.

In an exemplary embodiment, the first power supply wire is provided with a sixteenth protrusion extending in a second direction, the sixteenth protrusion is located on a side of the first power supply wire close to the second power supply wire, and the sixteenth protrusion includes a sixteenth tip; the second power supply wire is provided with a seventeenth protrusion extending in a second direction, the seventeenth protrusion is located on a side of the second power supply wire close to the first power supply wire, and the seventeenth protrusion includes a seventeenth tip; the sixteenth tip of the first power supply wire is disposed opposite to the seventeenth tip of the second power supply wire; an orthographic projection of the sixth discharge structure on the substrate at least partially overlaps with an orthographic projection of the sixteenth tip of the first power supply wire on the substrate and an orthographic projection of the seventeenth tip of the second power supply wire on the substrate.

In an exemplary embodiment, the drive circuit layer further includes: a plurality of first scan connection portions, a plurality of second scan connection portions, a plurality of data connection portions, a plurality of power connection portions, a plurality of sense signal lines, a plurality of sense connection portions, and a power connection line; the first scan connection portions are electrically connected to the first scan signal lines, the second scan connection portions are electrically connected to the second scan signal lines, the data connection portions are electrically connected to the data signal lines, the power connection portions are electrically connected to the first power line, the sense signal lines are electrically connected to the pixel circuits and the sense connection portions, and the power connection line is electrically connected to the second power line and the second power supply wire, respectively.

In an exemplary embodiment, the drive circuit layer includes: a shield layer, a semiconductor layer, a first conductive layer, and a second conductive layer; the shield layer at least includes a second power line; the semiconductor layer at least includes one or more of a first discharge structure to a sixth discharge structure; the first conductive layer at least includes a first power supply wire, a second power supply wire, a first low-level power line, a second low-level power line, a first scan signal line, a second scan signal line, the data connection portions, the power connection portions and the sense connection portions, the second conductive layer at least includes a data signal line, a first power line, a first signal connection line, a second signal connection line, an electrostatic discharge line, the first scan output lines, the second scan output lines, the first scan connection portions, the second scan connection portions, a power connection line, the first low-level connection portions and the second low-level connection portions.

In second aspect, the present disclosure further provides a display apparatus including the display panel described above.

Other aspects may be understood upon reading and understanding the drawings and detailed description.

BRIEF DESCRIPTION OF DRAWINGS

Accompanying drawings are used for providing understanding of technical solutions of the present disclosure, and form a part of the specification. They are used for explaining the technical solutions of the present disclosure together with embodiments of the present disclosure, but do not form a limitation on the technical solutions of the present disclosure.

DETAILED DESCRIPTION

Figure 1:
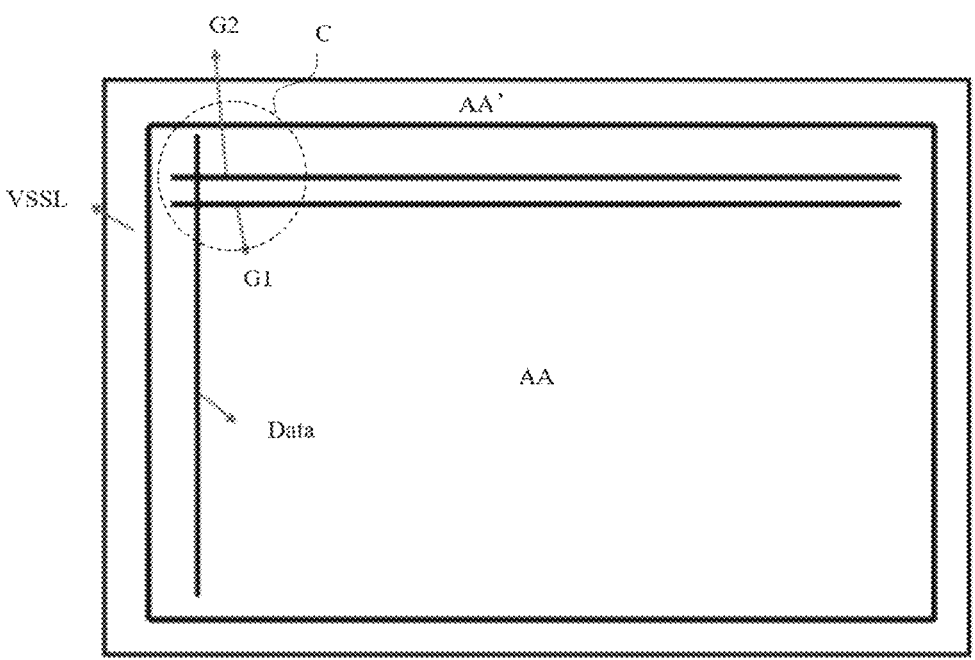
FIG. 1 is a block diagram of a structure of a display panel.

To make objectives, technical solutions, and advantages of the present disclosure clearer, the embodiments of the present disclosure will be described in detail with reference to the accompanying drawings. It is to be noted that implementations may be practiced in a plurality of different forms. Those of ordinary skills in the art may easily understand such a fact that implementations and contents may be transformed into various forms without departing from the purpose and scope of the present disclosure. Therefore, the present disclosure should not be explained as being limited to contents described in following implementations only. The embodiments in the present disclosure and features in the embodiments may be combined randomly with each other if there is no conflict. In order to keep the following description of the examples of the present disclosure clear and concise, detailed descriptions of part of known functions and known components are omitted in the present disclosure. The drawings in the embodiments of the present disclosure relate only to the structures involved in the embodiments of the present disclosure, and other structures may be described with reference to conventional designs.

Scales of the drawings in the present disclosure may be used as a reference in actual processes, but are not limited thereto. For example, a width-length ratio of a channel, a thickness of each film layer and a spacing between two film layers, and a width of each signal line and a spacing between two signal lines may be adjusted according to actual needs. The quantity of pixels in the display panel and the quantity of sub-pixels in each pixel are not limited to the quantities shown in the drawings. The drawings described in the present disclosure are schematic structure diagrams only, and one implementation of the present disclosure is not limited to the shapes, numerical values or the like shown in the drawings.

Ordinal numerals such as "first", "second", and "third" in the specification are set to avoid confusion between constituent elements, but not to set a limit in quantity.

In the specification, for convenience, wordings indicating orientation or positional relationships, such as "middle", "upper", "lower", "front", "back", "vertical", "horizontal", "top", "bottom", "inside", and "outside", are used for illustrating positional relationships between constituent elements with reference to the drawings, and are merely for facilitating the description of the specification and simplifying the description, rather than indicating or implying that a referred device or element must have a particular orientation and be constructed and operated in the particular orientation. Therefore, they cannot be understood as limitations on the present disclosure. The positional relationships between the constituent elements may be changed as appropriate according to directions for describing the various constituent elements. Therefore, appropriate replacements may be made according to situations without being limited to the wordings described in the specification.

In the specification, unless otherwise specified and defined explicitly, terms "mount", "mutually connect", and "connect" should be understood in a broad sense. For example, a connection may be a fixed connection, or a detachable connection, or an integrated connection. It may be a mechanical connection or an electrical connection. It may be a direct mutual connection, or an indirect connection through middleware, or an internal communication between two elements. Those of ordinary skills in the art may understand specific meanings of these terms in the present disclosure according to specific situations.

In the specification, a transistor refers to an element which at least includes three terminals, i.e., a gate electrode, a drain electrode and a source electrode. The transistor has a channel region between the drain electrode (drain electrode terminal, drain region, or drain) and the source electrode (source electrode terminal, source region, or source), and a current can flow through the drain electrode, the channel region, and the source electrode. It is to be noted that, in the specification, the channel region refers to a region through which the current mainly flows.

In the specification, a first electrode may be a drain electrode, and a second electrode may be a source electrode. Or, the first electrode may be a source electrode, and the second electrode may be a drain electrode. In cases that transistors with opposite polarities are used, a current direction changes during operation of a circuit, or the like, functions of the "source electrode" and the "drain electrode" are sometimes interchangeable. Therefore, the "source electrode" and the "drain electrode" are interchangeable in the specification.

In the specification, "electrical connection" includes a case that constituent elements are connected together through an element with a certain electrical effect. The "element with the certain electrical effect" is not particularly limited as long as electrical signals may be sent and received between the connected constituent elements. Examples of the "element with the certain electrical effect" not only include electrodes and wirings, but also include switch elements such as transistors, resistors, inductors, capacitors, other elements with various functions, etc.

In the specification, "parallel" refers to a state in which an angle formed by two straight lines is above −10° and below 10°, and thus also includes a state in which the angle is above −5° and below 5°. In addition, "perpendicular" refers to a state in which an angle formed by two straight lines is above 80° and below 100°, and thus also includes a state in which the angle is above 85° and below 95°.

In the specification, a "film" and a "layer" are interchangeable. For example, a "conductive layer" may be replaced with a "conductive film" sometimes. Similarly, an "insulation film" may be replaced with an "insulation layer" sometimes.

In this specification, "being disposed in a same layer" refers to a structure formed by patterning two (or more than two) structures through a same patterning process, and their materials may be the same or different. For example, materials of precursors forming a plurality of structures disposed in a same layer are the same, and resultant materials may be the same or different.

Triangle, rectangle, trapezoid, pentagon and hexagon in this specification are not strictly defined, and they may be approximate triangle, rectangle, trapezoid, pentagon or hexagon, etc. There may be some small deformation caused by tolerance, and there may be chamfer, arc edge and deformation, etc.

In the present disclosure, "about" refers to that a boundary is defined not so strictly and numerical values within process and measurement error ranges are allowed.

In the field of display, in order to achieve high uniformity, display panels are often prepared by oxide process. But for oversized display panel, it is easy to produce instantaneous large static electricity in use because of its large size, which leads to panel damage and reduces the reliability of display panel.

Figure 2:
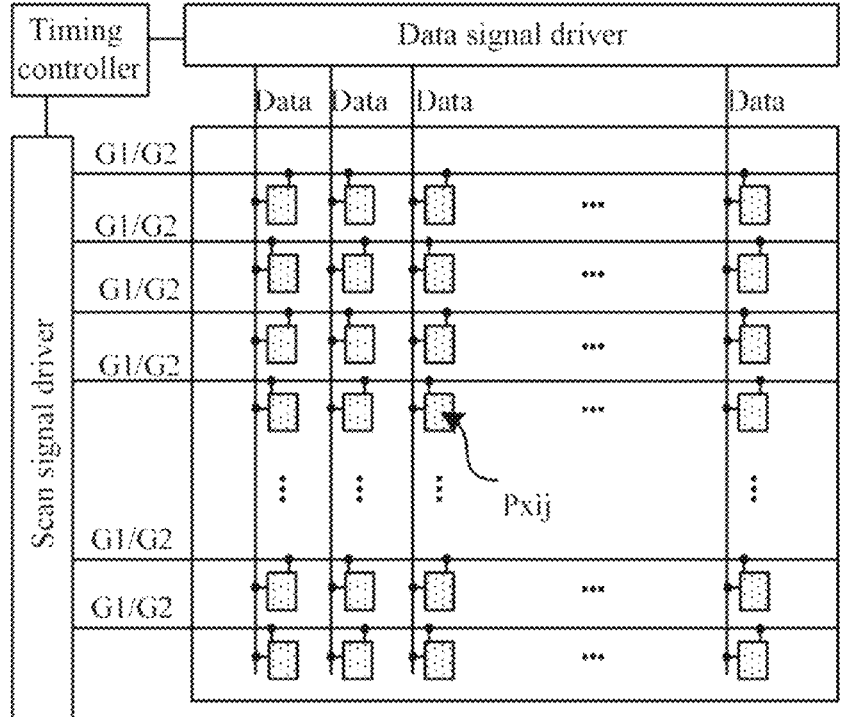
FIG. 2 is a schematic diagram of a structure of a display panel.

FIG. 1 is a block diagram of a structure of a display panel. FIG. 2 is a schematic structural diagram of a display panel. As shown in FIGS. 1 and 2, the display panel includes a display region AA and a non-display region AA' located on at least one side of the display region. The display panel may include a timing controller located in a non-display region, a data signal driver, a scan signal driver, and a pixel array located in a display region. The pixel array may include a plurality of first scan signal lines G1 and a plurality of second scan signal lines G2, a plurality of data signal lines "Data" and a plurality of sub-pixels.

In an exemplary embodiment, the timing controller may provide a grayscale value and a control signal suitable for a specification of the data signal driver to the data signal driver, and provide a clock signal, a scan start signal, and etc. suitable for a specification of the scan signal driver to the scan signal driver.

In an exemplary embodiment, the data signal driver may generate a data voltage to be provided to the data signal lines "Data" using the gray-scale value and the control signal received from the timing controller. For example, the data signal driver may sample the gray-scale value using the clock signal, and apply the data voltage corresponding to the gray-scale value to the data signal line "Data" by taking a sub-pixel row as a unit.

In an exemplary embodiment, the scan signal driver may generate scan signals to be supplied to the plurality of first scan signal lines G1 and the plurality of second scan signal lines G2 by receiving a clock signal, a scan start signal, etc. from the timing controller. For example, the scan signal driver may sequentially supply a scan signal having a turn-on level pulse to a plurality of first scan signal lines G1 and a plurality of second scan signal lines G2. For example, the scan signal driver may be constructed in a form of a shift register and may generate a scan signal in a manner of sequentially transmitting a scan start signal provided in a form of an on-level pulse to a next-stage circuit under control of a clock signal.

In an exemplary embodiment, the sub-pixel array may include a plurality of sub-pixels Pxij. Each sub-pixel Pxij can be connected to a corresponding data signal line and a corresponding first scan signal line and a second scan signal line, and i and j can be natural numbers. The sub-pixel Pxij may refer to a sub-pixel in which transistors are connected to the i-th first scan signal line and the i-th second scan signal line and connected to the j-th data signal line.

In an exemplary embodiment, the display panel may include a plurality of pixel units arranged in a matrix, at least one of the plurality of pixel units includes a first sub-pixel emitting light of a first color, a second sub-pixel emitting light of a second color, and a third sub-pixel emitting light of a third color, and the first sub-pixel, the second sub-pixel, and the third sub-pixel each includes a pixel circuit and a light emitting device. The pixel circuits in the first sub-pixel, the second sub-pixel and the third sub-pixel are respectively connected to the scan signal line and the data signal line. The pixel circuit is configured to receive a data voltage transmitted by the data signal line and output a corresponding current to the light emitting device under the control of the first scan signal line and the second scan signal line. The light emitting devices in the first sub-pixel, the second sub-pixel and the third sub-pixel are respectively connected to the pixel circuits of the sub-pixels where the light emitting devices are located. The light emitting device is configured to emit light of corresponding brightness in response to a current output by the pixel circuit of the sub-pixel where the light emitting device is located.

In an exemplary embodiment, the light emitting device may be an Organic Light Emitting Diode (OLED), including a first electrode (anode), an organic light emitting layer, and a second electrode (cathode) that are stacked.

In an exemplary embodiment, the organic light emitting layer may include a Light Emitting Layer (EML), and any one or more of following layers: a Hole Injection Layer (HIL), a Hole Transport Layer (HTL), an Electron Block Layer (EBL), a Hole Block Layer (HBL), an Electron Transport Layer (ETL), and an Electron Injection Layer (EIL). In an exemplary embodiment, one or more of hole injection layers, hole transport layers, electron block layers, hole block layers, electron transport layers and electron injection layers of all sub-pixels may be connected together to form a common layer. The light emitting layers of adjacent sub-pixels may overlap slightly with each other, or may be isolated from each other.

In an exemplary embodiment, the first sub-pixel may be a red (R) sub-pixel emitting red light, the second sub-pixel may be a blue (B) sub-pixel emitting blue light, and the third sub-pixel may be a green (G) sub-pixel emitting green light. In an exemplary embodiment, a sub-pixel may be in a shape of a rectangle, a rhombus, a pentagon, or a hexagon. Three sub-pixels may be arranged side by side horizontally, side by side vertically, or in a manner like a delta, and the present disclosure is not limited thereto.

In other exemplary embodiments, the pixel unit may include four sub-pixels. In an exemplary embodiment, the first sub-pixel may be a red sub-pixel (R) emitting red light, the second sub-pixel may be a blue sub-pixel (B) emitting blue light, the third sub-pixel may be a green sub-pixel (G) emitting green light, and the fourth sub-pixel may be a white sub-pixel (W) emitting white light. In an exemplary embodiment, a shape of a sub-pixel in a pixel unit may be a rectangle, a rhombus, a pentagon, or a hexagon, etc., and the sub-pixels may be arranged in a manner to stand side by side horizontally, in a manner to stand side by side vertically, in a manner to form a square, or in a manner to form a diamond, etc., and the present disclosure is not limited herein.

Figure 3:
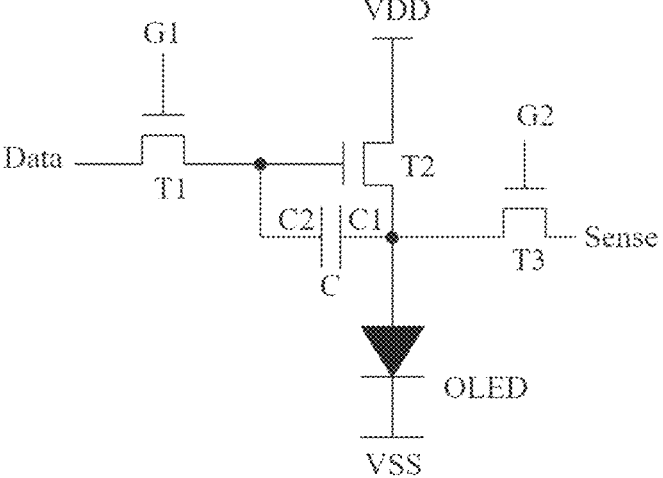
FIG. 3 is a schematic diagram of an equivalent circuit of a pixel circuit.

In an exemplary embodiment, the pixel circuit may be in a 3T1C, 4T1C, 5T1C, 5T2C, 6T1C, or 7T1C structure. FIG. 3 is a schematic diagram of an equivalent circuit of a pixel circuit. As shown in FIG. 3, the pixel drive circuit has a 3T1C structure, and may include three transistors (a first transistor T1, a second transistor T2, and a third transistor T3), one storage capacitor C, and six signal lines (a data signal line "Data", a first scan signal line G1, a second scan signal line G2, a sense signal line "Sense", a first power line VDD, and a second power line VSS). In an exemplary embodiment, the first transistor T1 is a switch transistor, the second transistor T2 is a drive transistor, and the third transistor T3 is a sense transistor. A gate electrode of the first transistor T1 is coupled to the first scan signal line G1, a first electrode of the first transistor T1 is coupled to the data signal line "Data", a second electrode of the first transistor T1 is coupled to a gate electrode of the second transistor T2. The first transistor T1 is configured to receive a data signal transmitted by the data signal line "Data" under control of the first scan signal line G1, so that the gate electrode of the second transistor T2 receives the data signal. A gate electrode of the second transistor T2 is coupled to the second electrode of the first transistor T1, a first electrode of the second transistor T2 is coupled to the first power line VDD, a second electrode of the second transistor T2 is coupled to a first electrode of a light emitting device OLED, and the second transistor T2 is configured to generate a corresponding current at the second electrode under the control of the data signal received by the gate electrode of the second transistor. A gate electrode of the third transistor T3 is coupled to the second scan signal line G2, a first electrode of the third transistor T3 is connected to the sense signal line "Sense", a second electrode of the third transistor T3 is coupled to the second electrode of the second transistor T2. The third transistor T3 is configured to extract a threshold voltage Vth and a mobility of the second transistor T2 in response to compensation timing to compensate the threshold voltage Vth. The first electrode of the light emitting device OLED is coupled to the second electrode of the second transistor T2, a second electrode of the light emitting device OLED is coupled to the second power line VSS, and the light emitting device OLED is configured to emit light with corresponding brightness in response to the current of the second electrode of the second transistor T2.

In an exemplary embodiment, the third transistor T3 may respond to the sense timing to extract the threshold voltage Vth and the mobility of the second transistor T2.

In an exemplary embodiment, the capacitor C includes a first electrode plate C1 and a second electrode plate C2, the second electrode plate C2 of the capacitor C is coupled to a gate electrode of the second transistor T2, the first electrode plate of the capacitor C is coupled to a second electrode of the second transistor T2, and the capacitor C is used to store the potential of the gate electrode of the second transistor T2.

In an exemplary embodiment, a second electrode of the light emitting device is connected to the second power line VSS, a signal of the second power line VSS is a low-level signal, and a signal of the first power line VDD is a high-level signal continuously provided.

Distinguished by their characteristics, transistors may be divided into N-type transistors and P-type transistors. When the transistor is a P type transistor, its turn-on voltage is a low-level voltage (e.g., 0V, −5V, −10V or other suitable voltages) and its turn-off voltage is a high-level voltage (e.g., 5V, 10V or other suitable voltages). When the transistor is an N type transistor, its turn-on voltage is a high-level voltage (e.g., 5V, 10V or other suitable voltages) and its turn-off voltage is a low-level voltage (e.g., 0V, −5V, −10V or other suitable voltages).

In an exemplary embodiment, the first transistor T1 to the third transistor T3 may be P-type transistors, or may be N-type transistors. Use of the same type of transistors in the pixel drive circuit may simplify a process flow, reduce the process difficulty of a display panel, and improve the product yield. In some possible implementations, the first transistor T1 to the seventh transistor T7 may include P-type transistors and N-type transistors.

In an exemplary embodiment, for the first transistor T1 to the third transistors T3, low temperature poly silicon thin film transistors may be adopted, oxide thin film transistors may be adopted, or both of a low temperature poly silicon thin film transistor and an oxide thin film transistor may be adopted. An active layer of a low temperature poly-silicon thin film transistor may be made of Low Temperature Poly-Silicon (LTPS for short), and an active layer of an oxide thin film transistor may be made of an oxide semiconductor (Oxide). The low temperature poly-silicon thin film transistor has advantages such as high migration rate and fast charging. The oxide thin film transistor has advantages such as low leakage current. The low temperature poly-silicon thin film transistor and the oxide thin film transistor are integrated on one display panel to form a Low Temperature Polycrystalline Oxide (LTPO for short) display panel, so that advantages of the low temperature poly-silicon thin film transistor and the oxide thin film transistor can be utilized, low-frequency drive can be realized, power consumption can be reduced, and display quality can be improved.

Figure 4:
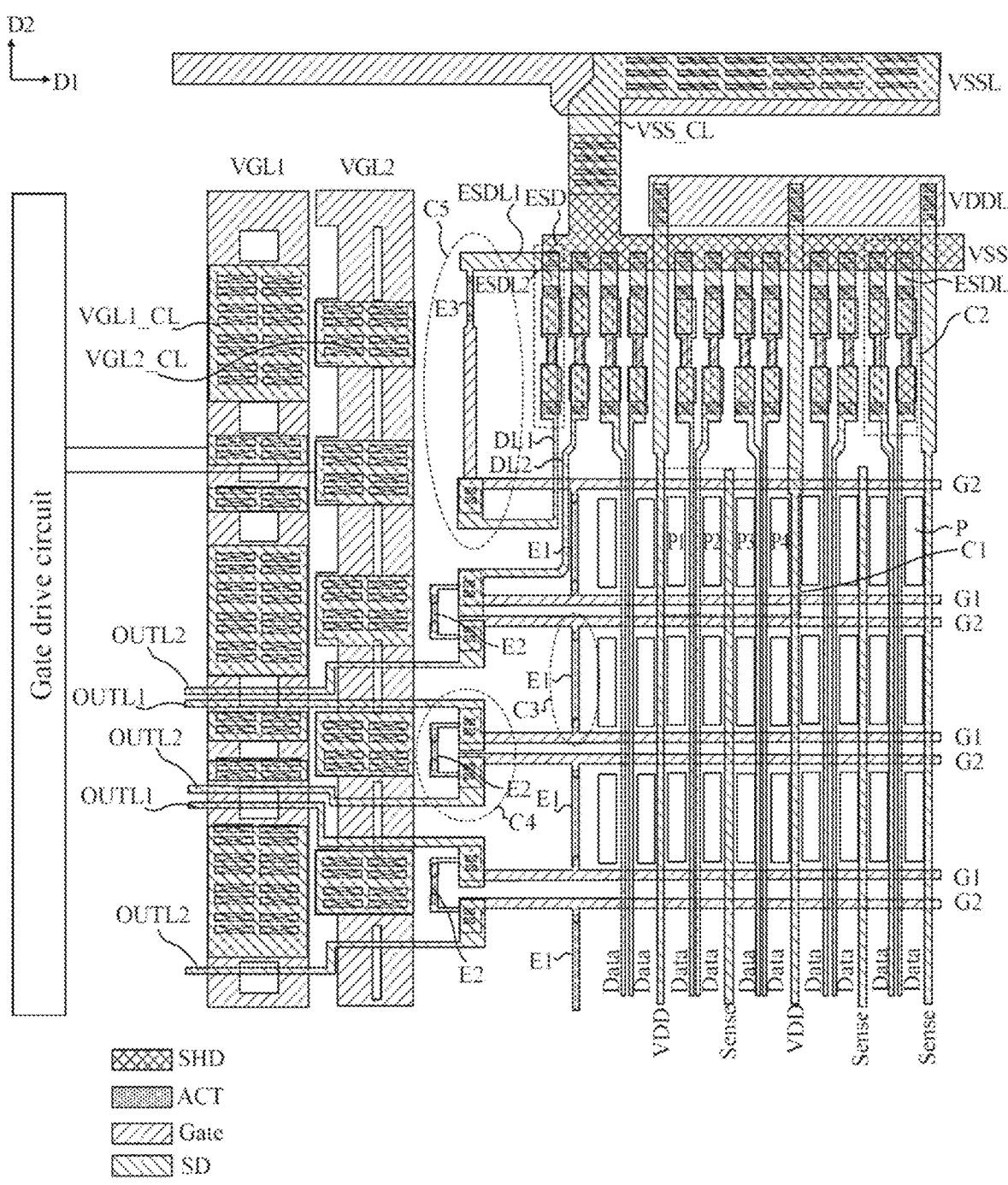
FIG. 4 is a first enlarged view of Region C in the display panel provided in FIG. 1.
Figure 5:
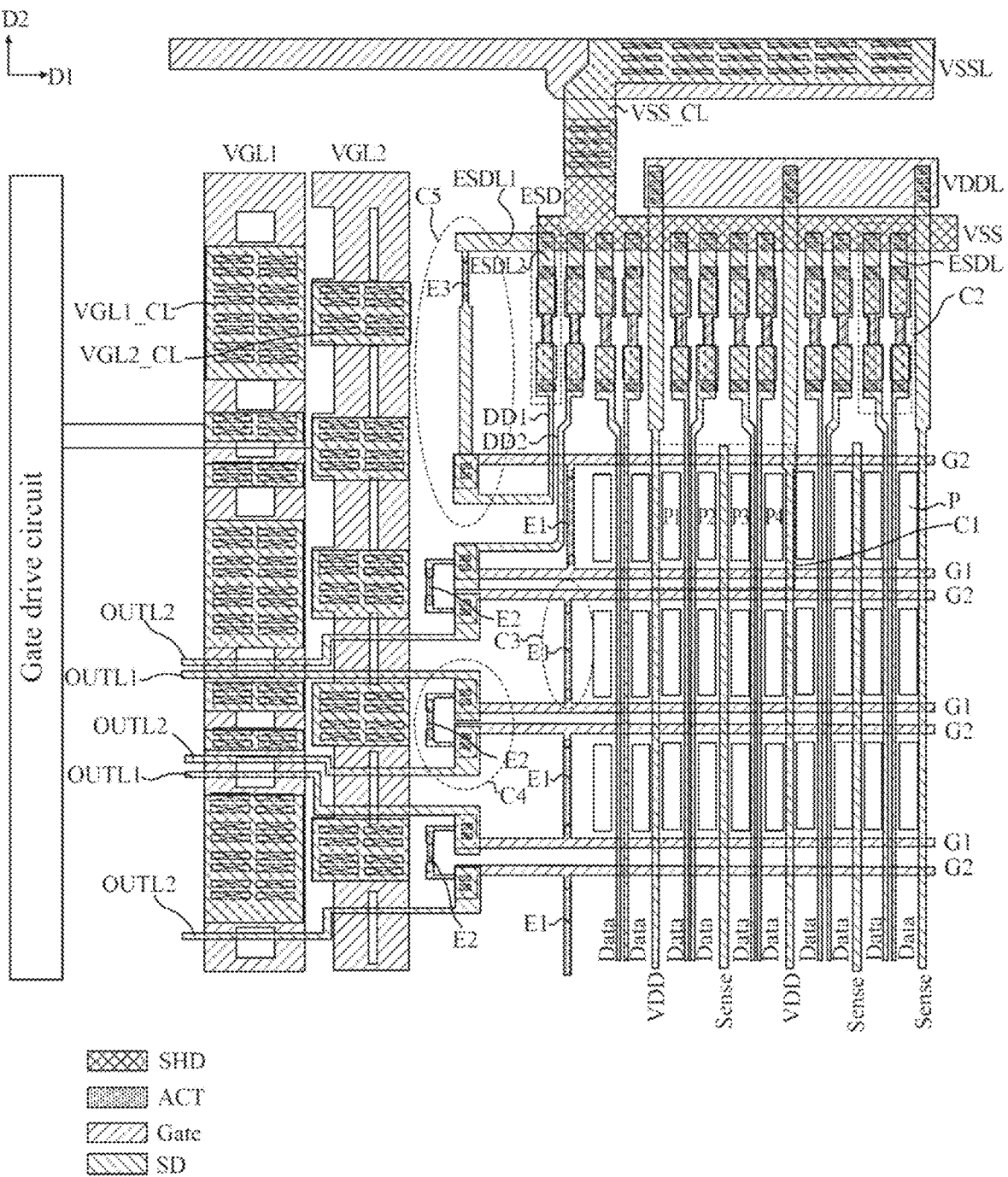
FIG. 5 is a second enlarged view of Region C in the display panel provided in FIG. 1.
Figure 6:
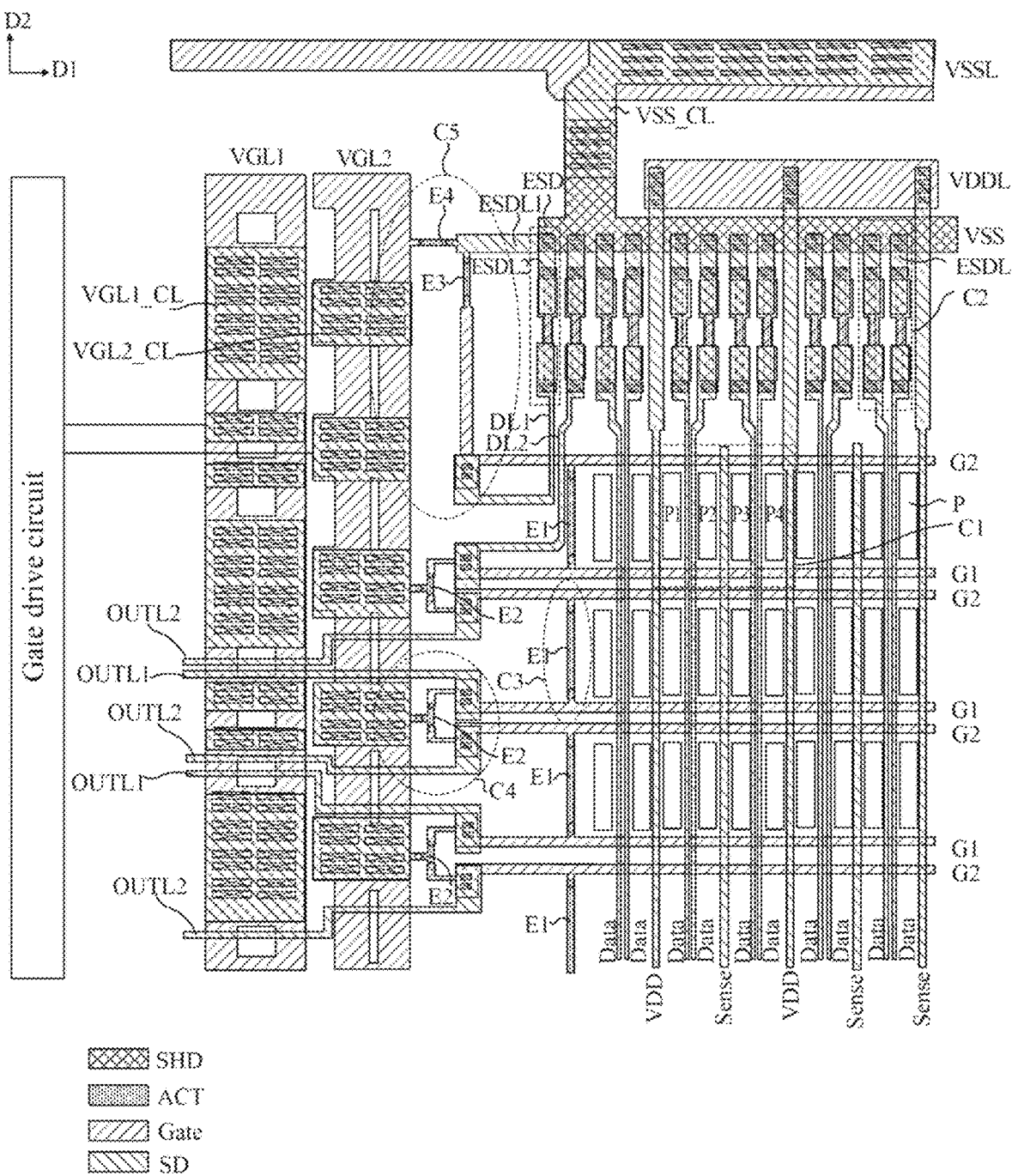
FIG. 6 is a third enlarged view of Region C in the display panel provided in FIG. 1.
Figure 7:
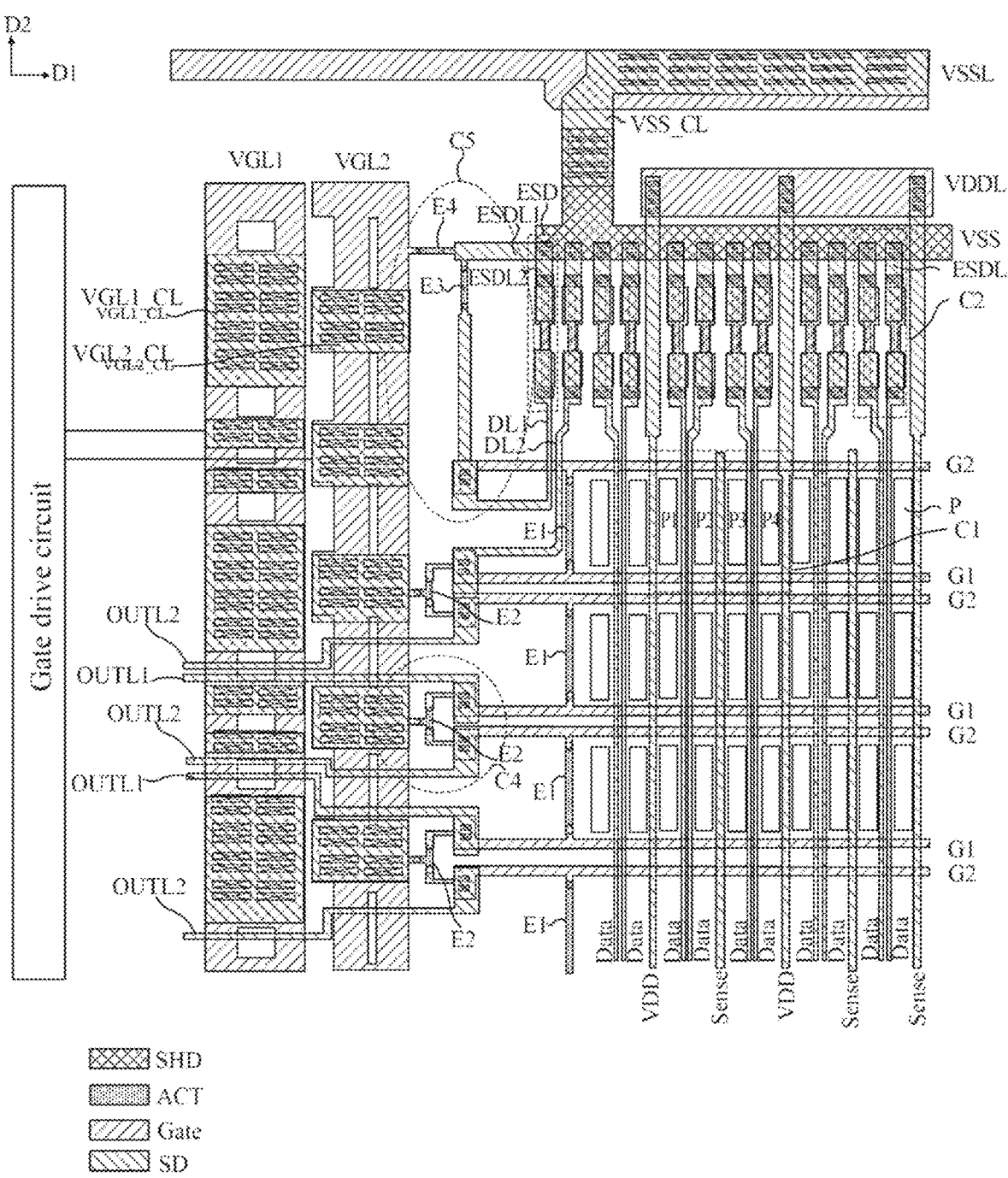
FIG. 7 is a fourth enlarged view of Region C in the display panel provided in FIG. 1.
Figure 8:
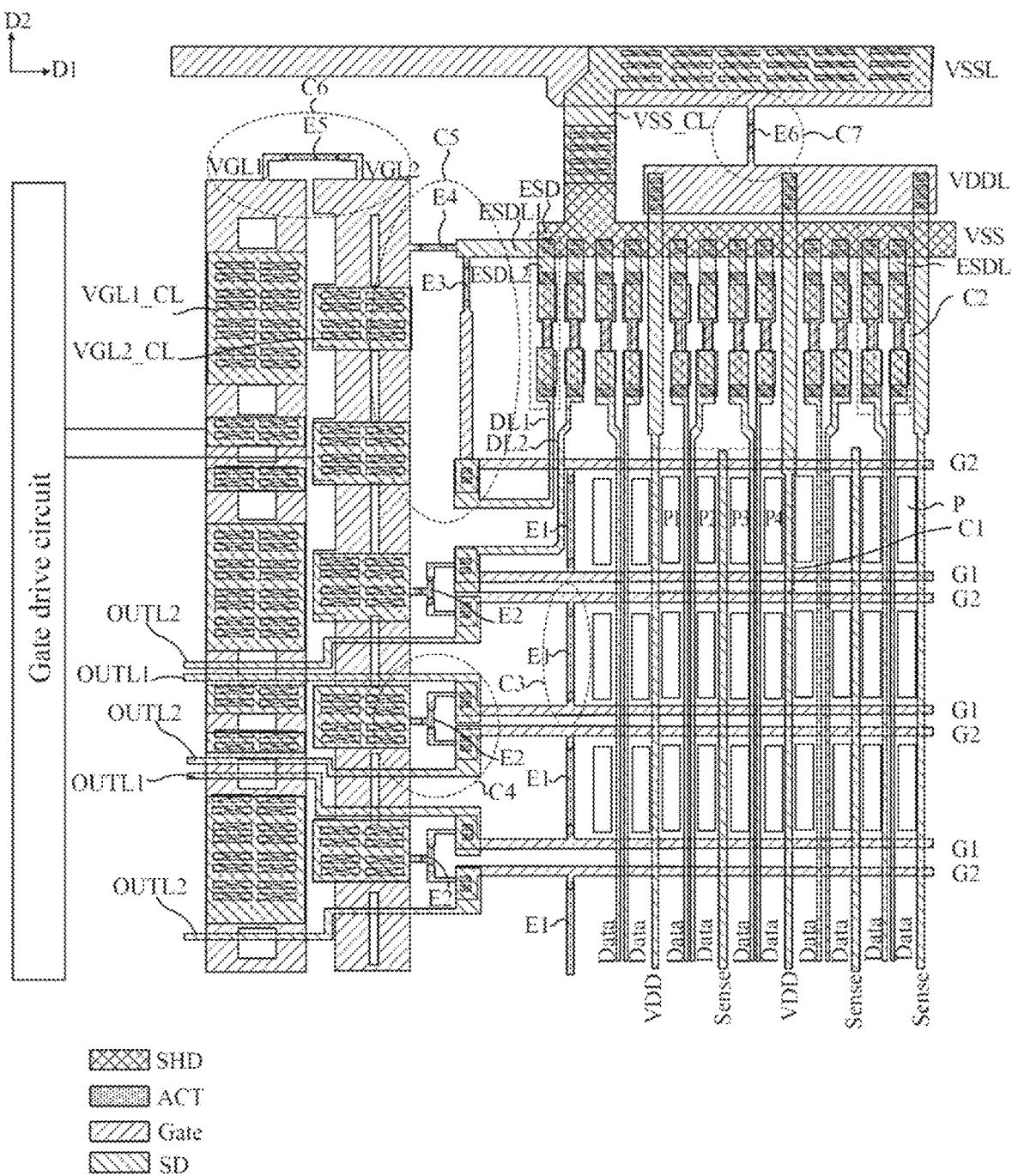
FIG. 8 is a fifth enlarged view of Region C in the display panel provided in FIG. 1.
Figure 9:
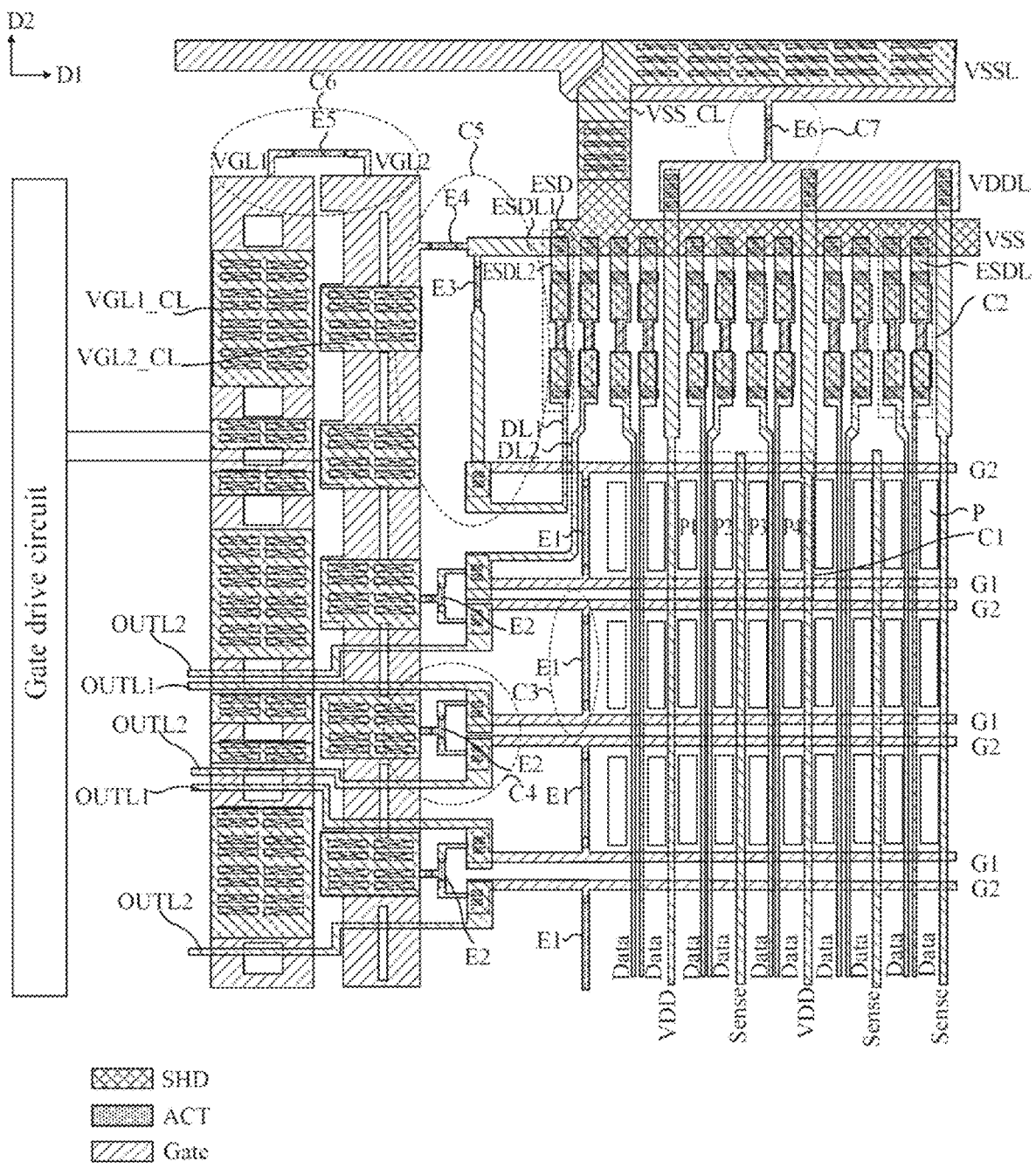
FIG. 9 is a sixth enlarged view of Region C in the display panel provided in FIG. 1.

FIG. 4 is a first enlarged view of Region C in the display panel provided in FIG. 1. FIG. 5 is a second enlarged view of Region C in the display panel provided in FIG. 1. FIG. 6 is a third enlarged view of Region C in the display panel provided in FIG. 1. FIG. 7 is a fourth enlarged view of Region C in the display panel provided in FIG. 1. FIG. 8 is a fifth enlarged view of Region C in the display panel provided in FIG. 1. FIG. 9 is a sixth enlarged view of Region C in the display panel provided in FIG. 1. As shown in FIGS. 4 to 9, a display panel provide by an embodiments of the present disclosure may include a substrate and a drive circuit layer disposed on the substrate. The substrate may include a display region and a non-display region. The drive circuit layer includes: an array of pixel circuits P located in the display region and a plurality of first scan signal lines G1 and a plurality of second scan signal lines G2 located at least partially in the display region, at least one pixel circuit P is electrically connected to the first scan signal lines G1 and the second scan signal lines G2 respectively, the first scan signal lines G1 and the second scan signal lines G2 electrically connected to the pixel circuits P are respectively located on both sides of the pixel circuits and are extended at least partially in a first direction D1.

In an exemplary embodiment, as shown in FIGS. 4 to 9, the drive circuit layer may further include a plurality of first discharge structures E1 and/or a plurality of second discharge structures E2, at least one first discharge structure E1 is electrically connected to the first scan signal line G1 and the second scan signal line G2 respectively, the first scan signal line G1 and the second scan signal line G2 electrically connected to the first discharge structure are connected to the same row of pixel circuits, at least one second discharge structure E2 is electrically connected to the first scan signal line G1 and the second scan signal line G2 respectively, the first scan signal line G1 and the second scan signal line G2 electrically connected to the second discharge structure E2 are connected to adjacent row of pixel circuits and are located between the adjacent row of pixel circuits. FIGS. 4 to 9 illustrate that the display panel includes a first discharge structure E1 and a plurality of second discharge structures E2.

By arranging the first discharge structure and/or the second discharge structure, the first scan signal line and the second scan signal line electrically connected to all pixel circuits can be connected to form a discharge path. When static electricity is generated, the static electricity can be discharged to the first scan signal line and the second scan signal line to avoid damage to the display panel caused by instantaneous large static electricity, thus improving the reliability of the display panel.

In an exemplary embodiment, a base substrate may be a rigid base substrate, or may be a flexible base substrate. In an exemplary embodiment, the rigid base substrate may be made of a material such as glass or quartz, the flexible base substrate may be made of a material such as Polyimide (PI), the flexible base substrate may be of a single-layer structure, or may be of a laminated structure formed by an inorganic material layer and a flexible material layer, which is not limited in the present disclosure.

In an exemplary embodiment, the display panel may further include a light emitting structure layer disposed on a side of the drive circuit layer away from the substrate, and an encapsulation structure layer disposed on a side of the light emitting structure layer away from the base substrate. For example, the display substrate may include another film layer, such as a touch control structure layer, which is not limited in the present disclosure.

In an exemplary embodiment, the light emitting structure layer may include an anode, a pixel define layer, an organic light emitting layer and a cathode. The anode is connected to a drain electrode of the drive transistor through a via, the organic light emitting layer is connected to the anode, the cathode is connected to the organic light emitting layer, and the organic light emitting layer emits light of a corresponding color under the drive of the anode and the cathode.

In an exemplary embodiment, the encapsulation structure layer may include a first encapsulation layer, a second encapsulation layer, and a third encapsulation layer that are stacked. The first encapsulation layer and the third encapsulation layer may be made of an inorganic material, and the second encapsulation layer may be made of an organic material. The second encapsulation layer is provided between the first encapsulation layer and the third encapsulation layer, and it may be ensured that external water vapor cannot enter the light emitting structure layer.

In an exemplary embodiment, the touch structure layer may include a first touch insulating layer disposed on an encapsulation structure layer, a first touch metal layer disposed on the first touch insulating layer, a second touch insulating layer covering the first touch metal layer, a second touch metal layer disposed on the second touch insulating layer and a touch protection layer covering the second touch metal layer. The first touch metal layer may include a plurality of bridge electrodes, the second touch metal layer may include a plurality of first touch electrodes and second touch electrodes, and the first touch electrode or the second touch electrode may be connected to the bridge electrode through a via.

In an exemplary embodiment, the display panel of the present disclosure may be applied to a display apparatus with a pixel drive circuit, such as an OLED, a quantum dot display (QLED), a light emitting diode display (Micro LED or Mini LED), or a Quantum Dot Light Emitting Diode display (QDLED), which is not limited in the present disclosure.

In an exemplary embodiment, as shown in FIGS. 4 to 9, the drive circuit layer may further include a gate drive circuit located in a non-display region, a first low-level power line VGL1 and a second low-level power line VGL2 extending along the second direction D2, and a plurality of first scan output lines OUTL1 and a plurality of second scan output lines OUTL2 extending at least partially along the first direction D1, where the first direction D1 and the second direction D2 intersect.

In an exemplary embodiment, the gate drive circuit may be located in the scan signal driver.

In an exemplary embodiment, as shown in FIGS. 4 to 9, the first low-level power line VGL1 and the second low-level power line VGL2 may be disposed on the same layer, the first scan output line OUTL1 and the second scan output line OUTL2 may be disposed on the same layer, and the first low-level power line VGL1 may be located on a side of the first scan output line OUTL1 close to the substrate.

In an exemplary embodiment, as shown in FIGS. 4 to 9, the first scan output line OUTL1 is electrically connected to the first scan signal line G1, the second scan output line OUTL2 is electrically connected to the second scan signal line G2, and the gate drive circuit is electrically connected to the first low-level power line VGL1, the second low-level power line VGL2, a plurality of first scan output lines OUTL1, and a plurality of second scan output lines OUTL2, respectively.

In an exemplary embodiment, as shown in FIGS. 4 to 9, the first low-level power line VGL1 and the second low-level power line VGL2 are located on a side of the gate drive circuit close to the display region, and the first low-level power line VGL1 is located on a side of the second low-level power line VGL2 away from the display region.

In an exemplary embodiment, as shown in FIGS. 4 to 9, the drive circuit layer may further include a plurality of data signal lines "Data" located at least partially in the display region and a plurality of electrostatic discharge circuits ESD and a plurality of electrostatic discharge lines ESDL located in the non-display region, the data signal lines "Data" and the electrostatic discharge lines ESDL extend at least partially in the second direction D2, and the data signal lines "Data" are disposed in the same layer as the electrostatic discharge lines ESDL. The pixel circuit is electrically connected to the data signal line "Data", and at least one electrostatic discharge circuit ESD is electrically connected to the data signal line "Data" and the electrostatic discharge line ESDL, respectively.

In an exemplary embodiment, as shown in FIGS. 4 to 9, a plurality of electrostatic discharge circuits are arranged in the first direction D1.

In an exemplary embodiment, as shown in FIGS. 4 to 9, the drive circuit layer may further include a first power line VDD located at least partially in the display region, and a first power supply wire VDDL, a second power line VSS, and a second power supply wire VSSL located in the non-display region. The first power supply line VDDL provides a high-level signal and the second power supply wire VSSL provides a low-level signal.

In an exemplary embodiment, as shown in FIGS. 4 to 9, the first power supply wire VDDL and the second power supply wire VSSL may be disposed on the same layer, the first power line VDD is located on a side of the first power supply wire VDDL away from the substrate, and the second power line VSS is located on a side of the second power supply wire VSSL close to the substrate.

In an exemplary embodiment, as shown in FIGS. 4 to 9, the first power supply wire VDDL may be located on a side of the second power line VSS away from the display region, and the second power line VSS may partially surround the first power supply wire VDDL.

In an exemplary embodiment, as shown in FIGS. 1, 4 to 9, the second power supply wire VSSL is disposed on a side of the first power supply wire VDDL away from the display region and enclosed at least one side of the display region. FIG. 1 illustrates an example in which the second power supply wire VSSL is arranged around the display region.

In an exemplary embodiment, as shown in FIGS. 4 to 9, the pixel circuit is electrically connected to the first power line VDD, an orthographic projection of the first power supply wire VDDL on the substrate partially overlaps the orthographic projections of the first power line VDD and the second power line VSS on the substrate and is electrically connected to the first power line VDD. An orthographic projection of the second power line VSS on the substrate partially overlaps the orthographic projections of the plurality of electrostatic discharge lines ESDL and the first power line VDD on the substrate and is electrically connected to the plurality of electrostatic discharge lines ESDL and the second power supply wire VSSL, respectively.

In an exemplary embodiment, as shown in FIGS. 4 to 9, the drive circuit layer further includes a first signal connection line DL1 and a second signal connection line DL2, the first signal connection line DL1 and the second signal connection line DL2 extend at least partially in the first direction D1, and the first signal connection line DL1 and the second signal connection line DL2 are electrically connected to different electrostatic discharge circuits ESD, respectively. FIGS. 4 to 9 show that a first signal connection line DL1 is electrically connected to a first electrostatic discharge circuit ESD, and a second signal connection line DL2 is electrically connected to a second electrostatic discharge circuit ESD.

In an exemplary embodiment, as shown in FIGS. 4 to 9, the pixel circuit may include a first pixel circuit and a second pixel circuit, the second pixel circuit is located on a side of the first pixel circuit close to the second power supply wire VSSL. An orthographic projection of a first scan signal line G1 electrically connected to the first pixel circuit on the substrate partially overlaps an orthographic projection of the first scan output line OUTL1 on the substrate and the first scan signal line G1 is electrically connected to the first scan output line OUTL1, and an orthographic projection of a second scan signal line G2 electrically connected to the first pixel circuit on the substrate partially overlaps an orthographic projection of the second scan output line OUTL2 on the substrate and the second scan signal line G2 is electrically connected to the second scan output line OUTL2. An orthographic projection of a second scan signal line G2 electrically connected to the second pixel circuit on the substrate partially overlaps an orthographic projection of the first signal connection line DL1 on the substrate and the second scan signal line G2 is electrically connected to the first signal connection line DL1, and an orthographic projection of the first scan signal line G1 electrically connected to the second pixel circuit on the substrate partially overlaps an orthographic projection of the second signal connection line DL2 on the substrate and the first scan signal line G1 is electrically connected to the second signal connection line DL2. FIGS. 4 to 9 are illustrated by taking the first row of pixel circuits as the second pixel circuits and all pixel circuits except the first row of pixel circuits as the first pixel circuits as an example.

In an exemplary embodiment, as shown in FIGS. 4 to 9, the drive circuit layer further includes a plurality of first low-level connection portions VGL1_CL arranged at intervals and a plurality of second low-level connection portions VGL2_CL arranged at intervals, the first low-level connection portions VGL1_CL and the second low-level connection portions VGL2_CL are disposed in the same layer, and the first low-level connection portions VGL1_CL are located on a side of the first low-level power line VGL1 away from the substrate.

Figure 10:
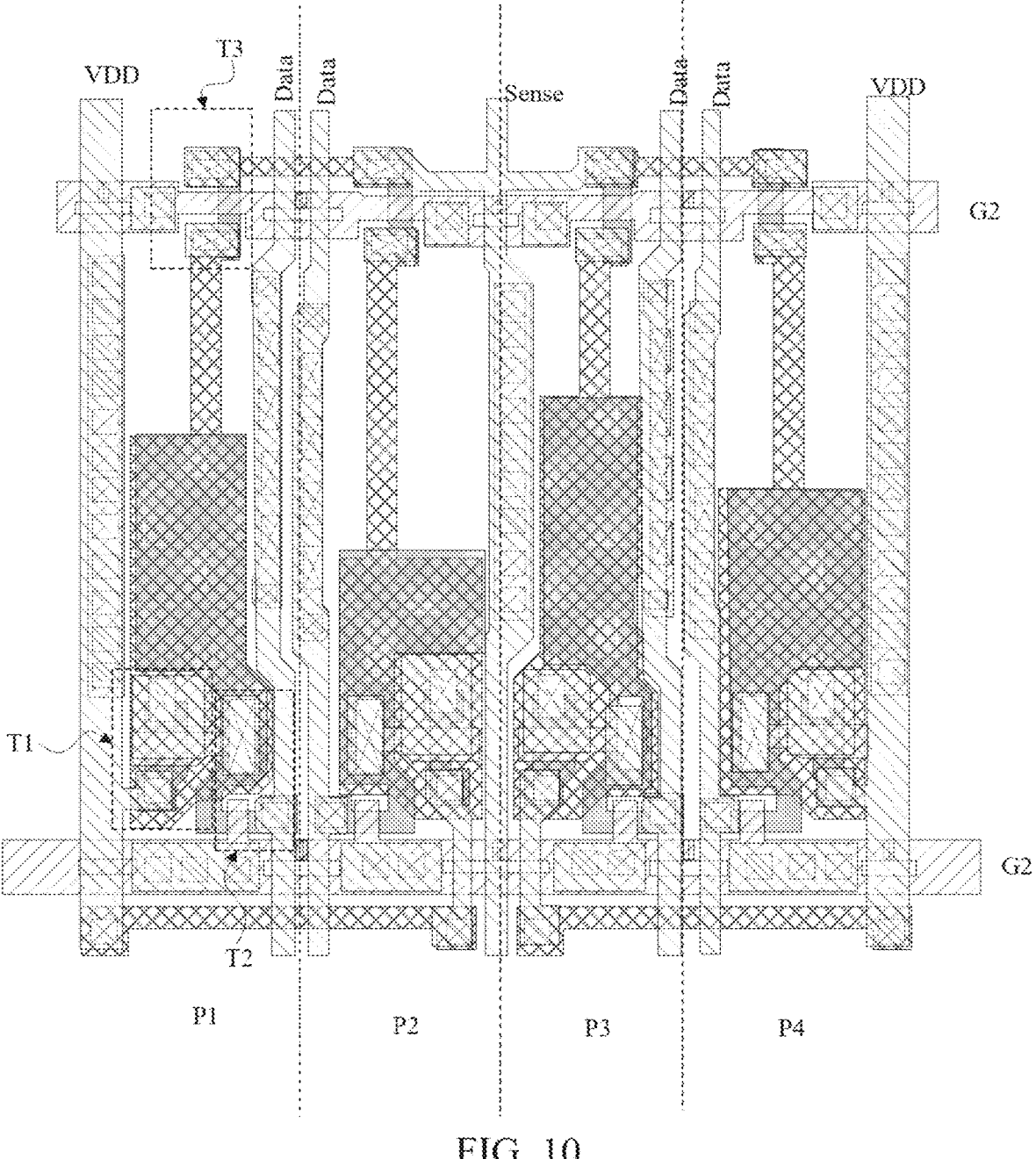
FIG. 10 is an enlarged view of Region C1 in the display panel provided in FIGS. 4 to 9.

FIG. 10 is an enlarged view of Region C1 in the display panel provided in FIGS. 4 to 9. FIG. 10 is an illustration of four pixel circuits P1 to P4. As shown in FIG. 10, the four pixel circuits P1 to P4 connect with two first power lines VDD, four data signal lines "Data", and one sense signal line "Sense". FIG. 10 illustrates an example of a pixel circuit including a first transistor T1 to a third transistor T3, which is not limited in this disclosure.

In an exemplary embodiment, as shown in FIG. 10, two first power lines VDD to which the four pixel circuits P1 to P4 are connected are located on a side of the first pixel circuit P1 away from the second pixel circuit P2 and a side of the fourth pixel circuit P4 away from the third pixel circuit P3, respectively.

In an exemplary embodiment, as shown in FIG. 10, a data signal line "Data" to which the first pixel circuit P1 is connected and a data signal line "Data" to which the second pixel circuit P2 is connected are located between the first pixel circuit P1 and the second pixel circuit P2, and the data signal line "Data" to which the first pixel circuit P1 is connected is located on a side of the data signal line "Data" to which the second pixel circuit P2 is connected close to the first pixel circuit P1. The data signal line "Data" to which the third pixel circuit P1 is connected and the data signal line "Data" to which the fourth pixel circuit P4 is connected are located between the third pixel circuit P3 and the fourth pixel circuit P4, and the data signal line "Data" to which the third pixel circuit P3 is connected is located on a side of the data signal line "Data" to which the fourth pixel circuit P4 is connected close to the third pixel circuit P3.

In an exemplary embodiment, as shown in FIG. 10, the sense signal line "Sense" to which the four pixel circuits P1 to P4 are connected is located between the third pixel circuit P3 and the fourth pixel circuit P4.

Figure 11:
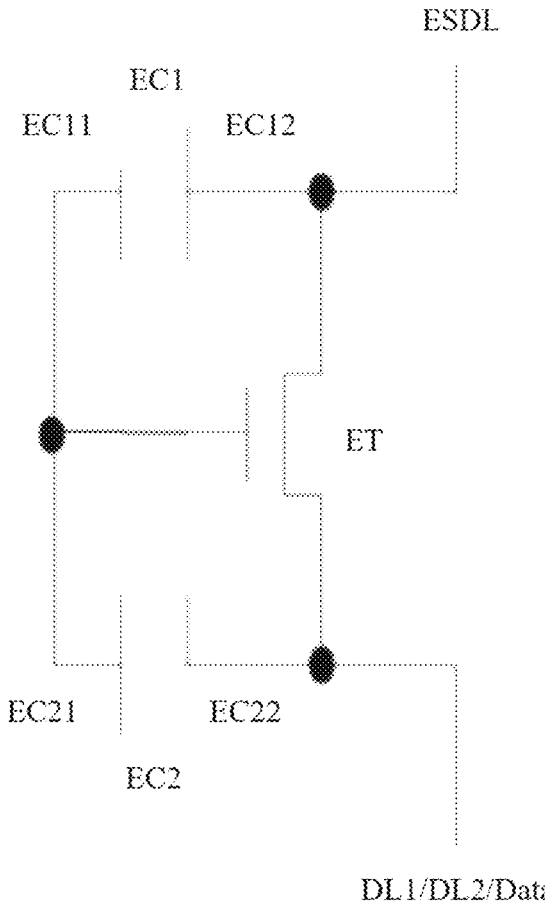
FIG. 11 is an equivalent circuit diagram of a shift register.

FIG. 11 is an equivalent circuit diagram of an electrostatic discharge circuit. As shown in FIG. 11, the electrostatic discharge circuit may include an electrostatic discharge transistor ET, a first electrostatic discharge capacitor EC1, and a second electrostatic discharge capacitor EC2. The first electrostatic discharge capacitor EC1 and the second electrostatic discharge capacitor EC2 each include two electrode plates, a first electrode plate and a second electrode plate.

In an exemplary embodiment, as shown in FIG. 11, a gate electrode of the electrostatic discharge transistor ET is electrically connected to a first electrode plate EC11 of the first electrostatic discharge capacitor EC1 and a first electrode plate EC21 of the second electrostatic discharge capacitor EC2, respectively. The first electrode of the electrostatic discharge transistor ET is electrically connected to a second electrode plate EC12 of the first electrostatic discharge capacitor EC1 and the electrostatic discharge line ESDL, respectively. The second electrode of the electrostatic discharge transistor ET is electrically connected to a second electrode plate EC22 of the second electrostatic discharge capacitor EC2, and the second electrode of the electrostatic discharge transistor ET is also electrically connected to the first signal connection line DL1, the second signal connection line DL2 or the data signal line "Data". When the electrostatic discharge circuit is the first electrostatic discharge circuit, the second electrode of the electrostatic discharge transistor ET is electrically connected to the first signal connection line DL1. When the electrostatic discharge circuit is a second electrostatic discharge circuit, a second electrode of the electrostatic discharge transistor ET is electrically connected to the second signal connection line DL2, and when the electrostatic discharge circuit is other electrostatic discharge circuits except the first electrostatic discharge circuit and the second electrostatic discharge circuit, a second electrode of the electrostatic discharge transistor ET is electrically connected to the data signal line "Data".

Figure 12:
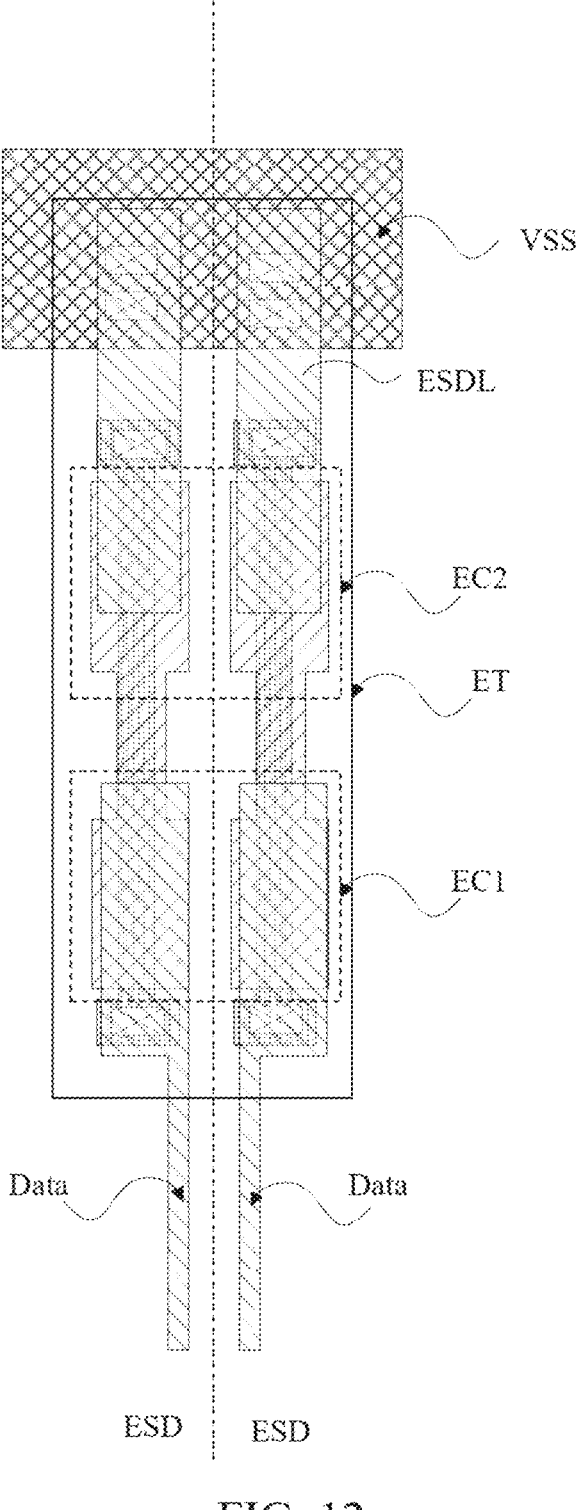
FIG. 12 is an enlarged view of Region C2 in the display panel provided in FIGS. 4 to 9.

FIG. 12 is an enlarged view of Region C2 in the display panel provided in FIGS. 4 to 9. FIG. 12 shows two electrostatic discharge circuits, and the second electrodes of the electrostatic discharge transistor ET in both electrostatic discharge circuits are electrically connected to the data signal line "Data" as an example. As shown in FIG. 12, an orthographic projection of the electrostatic discharge line ESDL on the substrate is electrically connected to the second power line VSS, and is electrically connected to the second power line VSS through a via.

Figure 13:
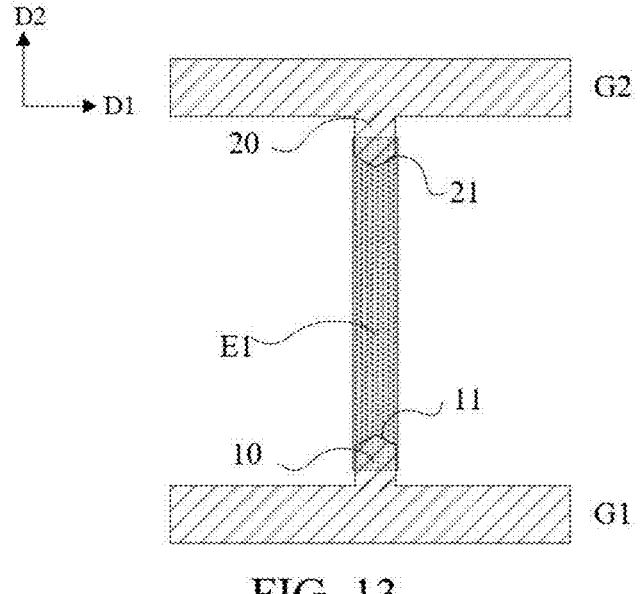
FIG. 13 is an enlarged view of Region C3 in the display panel provided in FIGS. 4 to 9.

In an exemplary embodiment, FIG. 13 is an enlarged view of Region C3 in the display panel provided in FIGS. 4 to 9. As shown in FIGS. 4 to 9 and 13, when the display panel includes a first discharge structure E1, the first scan signal line G1 is provided with a first protrusion 10 extending in the second direction D2, the first protrusion 10 is located on a side of the first scan signal line G1 close to the electrically connected pixel circuit, and the first protrusion 10 includes a first tip 11. The second scan signal line G2 is provided with a second protrusion 20 extending in a second direction D2, the second protrusion 20 is located on a side of the second scan signal line G2 close to the electrically connected pixel circuit, and the second protrusion 20 includes a second tip 21.

In an exemplary embodiment, as shown in FIGS. 4 to 9 and 13, the first tip 11 of the first scan signal line G1 electrically connected to the first discharge structure E1 is disposed opposite to the second tip 21 of the second scan signal line G2 electrically connected to the first discharge structure E1, and an orthographic projection of the first discharge structure E1 on the substrate at least partially overlaps an orthographic projection of the first tip 11 of the first scan signal line G1 electrically connected to the first discharge structure E1 on the substrate and an orthographic projection of the second tip 21 of the second scan signal line G2 electrically connected to the first discharge structure E1 on the substrate, respectively.

Figure 14:
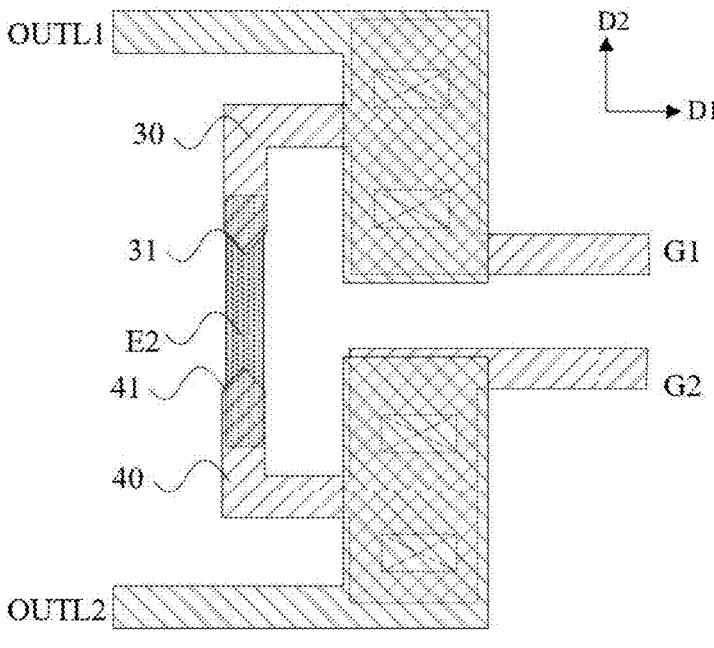
FIG. 14 is an enlarged view of Region C4 in the display panel provided in FIG. 4.

In an exemplary embodiment, FIG. 14 is an enlarged view of Region C4 in the display panel provided in FIG. 4. As shown in FIG. 14, when the display panel includes a second discharge structure E2, the first scan signal line G1 is provided with a third protrusion 30 extending at least partially in the second direction D2, the third protrusion 30 is located on a side of the first scan signal line G1 close to the gate drive circuit, and the third protrusion 30 includes a third tip 32. The second scan signal line G2 is further provided with a fourth protrusion 40 extending at least partially in the second direction D2, the fourth protrusion 40 is located on a side of the second scan signal line G2 close to the gate drive circuit, and the fourth protrusion 40 includes a fourth tip 41.

In an exemplary embodiment, as shown in FIGS. 4 and 14, the third tip 31 of the first scan signal line G1 electrically connected to the second discharge structure E2 is disposed opposite to the fourth tip 41 of the electrically connected second scan signal line G2, and an orthographic projection of the second discharge structure E2 on the substrate at least partially overlaps an orthographic projection of the third tip 31 of the electrically connected first scan signal line G1 on the substrate and an orthographic projection of the fourth tip 41 of the electrically connected second scan signal line G2 on the substrate, respectively.

Figure 15:
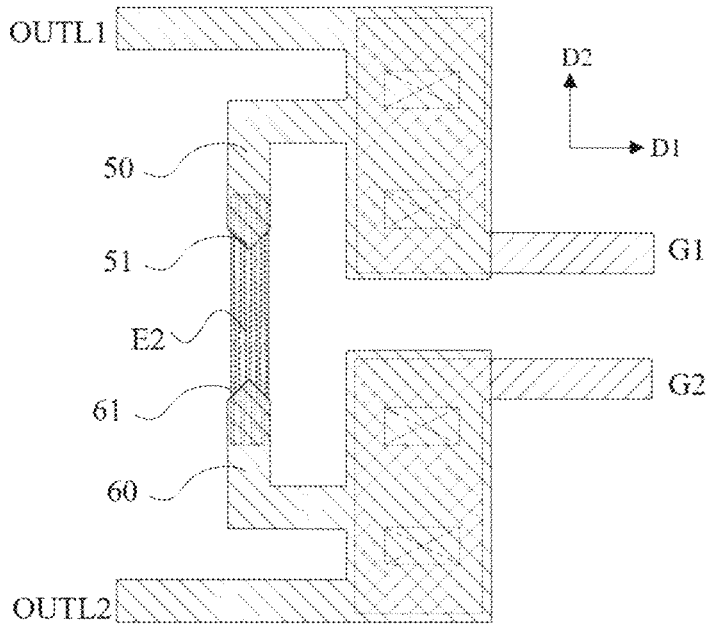
FIG. 15 is an enlarged view of Region C4 in the display panel provided in FIG. 5.

In an exemplary embodiment, FIG. 15 is an enlarged view of Region C4 in the display panel provided in FIG. 5. As shown in FIGS. 5 and 15, when the display panel includes a second discharge structure E2, the second discharge structure E2 is electrically connected to a first scan signal line G1 through a first signal line, and is electrically connected to the second scan signal line G2 through the second scan output line OUTL2, and the first signal line includes: the first scan output line OUTL1 or the second signal connection line DL2. When the pixel circuit electrically connected to the first scan signal line G1 is a first pixel circuit, the first signal line is the first scan output line OUTL1. When the pixel circuit electrically connected to the first scan signal is a second pixel circuit, the first signal line is the second signal connection line DL2. FIG. 15 illustrates an example of the first signal line being the first scan output line OUTL1.

In an exemplary embodiment, as shown in FIGS. 5 and 15, a first signal line to which the second discharge structure E2 is electrically connected is provided with a fifth protrusion 50 extending at least partially in the second direction D2, the fifth protrusion 50 is located on a side of the first signal line close to the gate drive circuit, and the fifth protrusion 50 includes a fifth tip 51. A second scan output line OUTL2 to which the second scan signal line G2 is electrically connected is provided with a sixth protrusion 60 extending at least partially in the second direction D2, the sixth protrusion 60 is located on a side of the second scan output line OUTL2 close to the gate drive circuit, and the sixth protrusion 60 includes a sixth tip 61.

In an exemplary embodiment, as shown in FIGS. 5 and 15, a fifth tip 51 of the first signal line electrically connected to the second discharge structure E2 is disposed opposite to a sixth tip 61 of the electrically connected second scan output line OUTL2, and an orthographic projection of the second discharge structure E2 on the substrate at least partially overlaps an orthographic projection of the fifth tip 51 of the electrically connected first signal line on the substrate and an orthographic projection of the sixth tip 61 of the electrically connected second scan output line OUTL2 on the substrate, respectively.

In an exemplary embodiment, as shown in FIGS. 6 to 9, the second discharge structure E2 is also electrically connected to the second low-level power line VGL2 or the second low-level connection portion VGL2_CL. FIG. 6 and FIG. 8 illustrate the second discharge structure E2 being electrically connect to the second low-level power line VGL2 as examples. FIG. 7 and FIG. 9 illustrate that the second discharge structure E2 being electrically connected to the second low-level connection portion VGL2_CL as an example.

Figure 16:
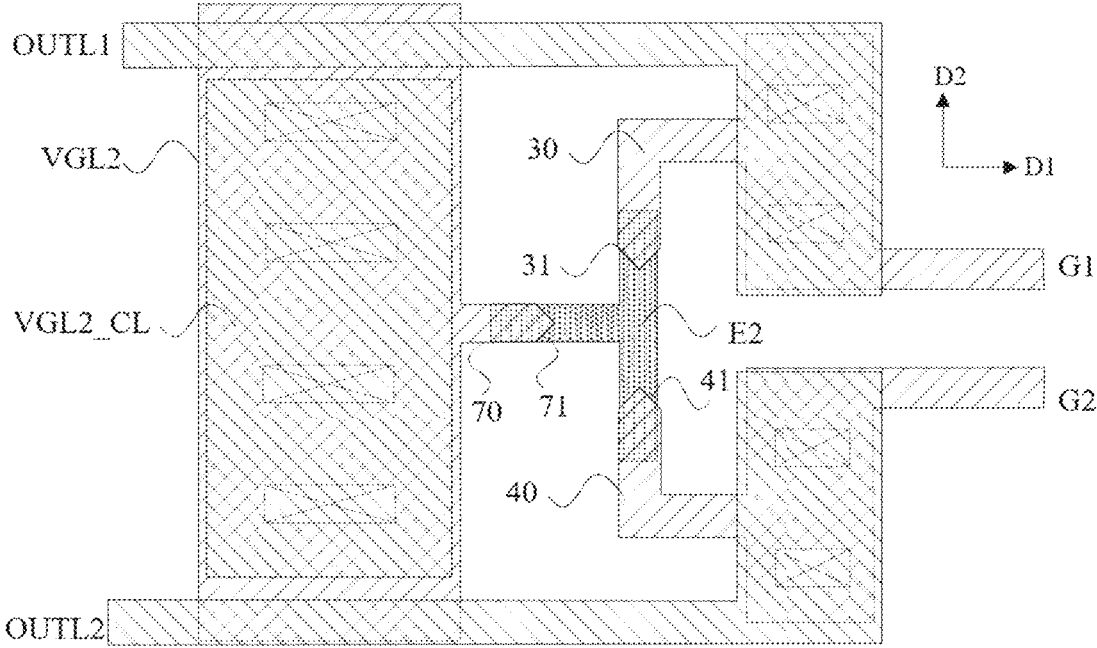
FIG. 16 is an enlarged view of Region C4 in the display panel provided in FIGS. 6 and 8.

In an exemplary embodiment, FIG. 16 is an enlarged view of Region C4 in the display panel provided in FIGS. 6 and 8. As shown in FIGS. 6, 8 and 16, when the second discharge structure E2 is electrically connected to the second low-level power line VGL2, the second low-level power line VGL2 is provided with a seventh protrusion 70 extending in the first direction D1, and the seventh protrusion 70 includes a seventh tip 71.

In an exemplary embodiment, as shown in FIGS. 6, 8 and 16, a dummy line passing through the seventh tip 71 and extending in the first direction D1 is located between the other two tips that at least partially overlap the second discharge structure E2 on the substrate. FIGS. 6, 8, and 16 are illustrated with the third tip 31 and the fourth tip 41 as the other two tips at least partially overlapping the second discharge structure E2 on the substrate, and in an exemplary embodiment, the other two tips at least partially overlapping the second discharge structure E2 on the substrate may be the fifth tip 51 and the sixth tip 61.

In an exemplary embodiment, as shown in FIGS. 6, 8 and 16, an orthographic projection of the second discharge structure E2 on the substrate partially overlaps an orthographic projection of the seventh tip 71 of the electrically connected second low-level power line VGL2 on the substrate.

Figure 17:
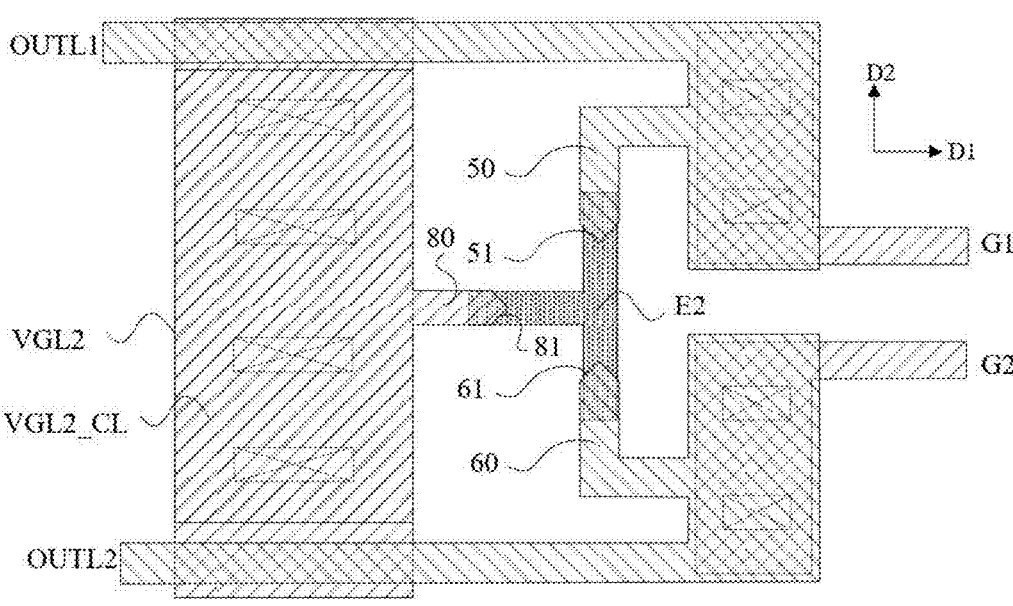
FIG. 17 is an enlarged view of Region C4 in the display panel provided in FIGS. 7 and 9.

In an exemplary embodiment, FIG. 17 is an enlarged view of Region C4 in the display panel provided in FIGS. 7 and 9. As shown in FIGS. 7, 9 and 17, when the second discharge structure is electrically connected to the second low-level connection VGL2_CL, the second low-level connection VGL2_CL is provided with an eighth protrusion 80 extending in the first direction D1, and the eighth protrusion 80 includes an eighth tip 81.

In an exemplary embodiment, as shown in FIGS. 7, 9, and 17, a dummy line passing through the eighth tip 81 and extending in the first direction D1 is located between the other two tips that at least partially overlap the second discharge structure on the substrate. FIGS. 7, 9, and 17 are illustrated with the fifth tip 51 and the sixth tip 61 as the other two tips at least partially overlapping the second discharge structure E2 on the substrate, and in an exemplary embodiment, the other two tips at least partially overlapping the second discharge structure E2 on the substrate may be the third tip 31 and the fourth tip 41.

In an exemplary embodiment, as shown in FIGS. 7, 9 and 17, an orthographic projection of the second discharge structure E2 on the substrate partially overlaps an orthographic projection of the eighth tip 81 of the electrically connected second low-level connection VGL2_CL on the substrate.

In an exemplary embodiment, as shown in FIGS. 4 to 9, the drive circuit layer may further include at least one of a third discharge structure E3, a fourth discharge structure E4, a fifth discharge structure E5, and a sixth discharge structure E6. The third discharge structure E3 is electrically connected to a scan signal line close to a non-display region and an electrostatic discharge line ESDL close to a gate drive circuit, respectively. The fourth discharge structure E4 is electrically connected to a second low-level power line VGL2 and an electrostatic discharge line ESDL close to a gate drive circuit, respectively. The fifth discharge structure E5 is electrically connected to a first low-level power line VGL1 and a second low-level power line VGL2, respectively. The sixth discharge structure E6 is electrically connected to a first power supply wire VDDL and a second power supply wire VSSL, respectively, and the scan signal line is either a first scan signal line G1 or a second scan signal line G2. FIG. 4 and FIG. 5 are explained by example including a third discharge structure, FIG. 6 and FIG. 7 are explained by example including a third discharge structure and a fourth discharge structure, and FIG. 8 and FIG. 9 are explained by example including a third discharge structure, a fourth discharge structure, a fifth discharge structure and a sixth discharge structure.

In an exemplary embodiment, the first discharge structure E1, the second discharge structure E2, the third discharge structure E3, the fourth discharge structure E4, the fifth discharge structure E5, and the sixth discharge structure E6 may be disposed in the same layer, which is not limited in this disclosure.

In an exemplary embodiment, as shown in FIGS. 6 to 9, when the drive circuit layer includes a third discharge structure E3 or a fourth discharge structure E4, the electrostatic discharge line ESDL close to the gate drive circuit includes a first connection line ESDL1 extending in the first direction D1 and a second connection line ESDL2 extending in the second direction D2, and the first connection line ESDL1 is electrically connected to the second connection line ESDL2.

Figure 18:
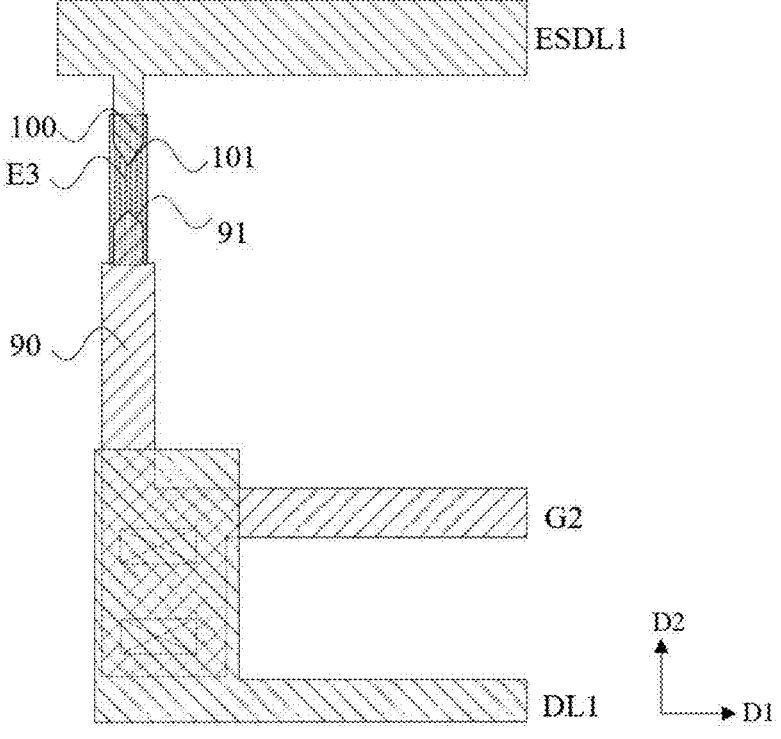
FIG. 18 is an enlarged view of Region C5 in the display panel provided in FIG. 4.

In an exemplary embodiment, FIG. 18 is an enlarged view of Region C5 in the display panel provided in FIG. 4. As shown in FIGS. 4 and 18, the scan signal line to which the third discharge structure E3 is electrically connected is provided with a ninth protrusion 90 extending in the second direction D2, the ninth protrusion 90 is located on a side of the scan signal line close to the electrostatic discharge circuit, and the ninth protrusion 90 includes a ninth tip 91. A first connection line ESDL1 of the electrostatic discharge line ESDL to which the third discharge structure E3 is electrically connected is provided with a tenth protrusion 100 located on a side of the first connection line ESDL1 close to the electrostatic discharge circuit ESD, and the tenth protrusion 100 includes a tenth tip 101. FIG. 4 illustrates an example of a scan signal line electrically connected to the third discharge structure E3 as a second scan signal line.

In an exemplary embodiment, as shown in FIGS. 4 and 18, a ninth tip 91 of the scan signal line to which the third discharge structure E3 is electrically connected and a tenth tip 101 of the electrostatic discharge line ESDL to which the third discharge structure E3 is electrically connected are oppositely disposed.

In an exemplary embodiment, as shown in FIGS. 4 and 18, an orthographic projection of the third discharge structure E3 on the substrate at least partially overlaps with an orthographic projection of the ninth tip 91 of the electrically connected scan signal line and the tenth tip 101 of the electrostatic discharge line ESDL electrically connected to the third discharge structure E3 on the substrate.

In an exemplary embodiment, as shown in FIG. 5, the third discharge structure E3 may be electrically connected to the scan signal line through the first signal connection line DL1.

Figures 19, 20:
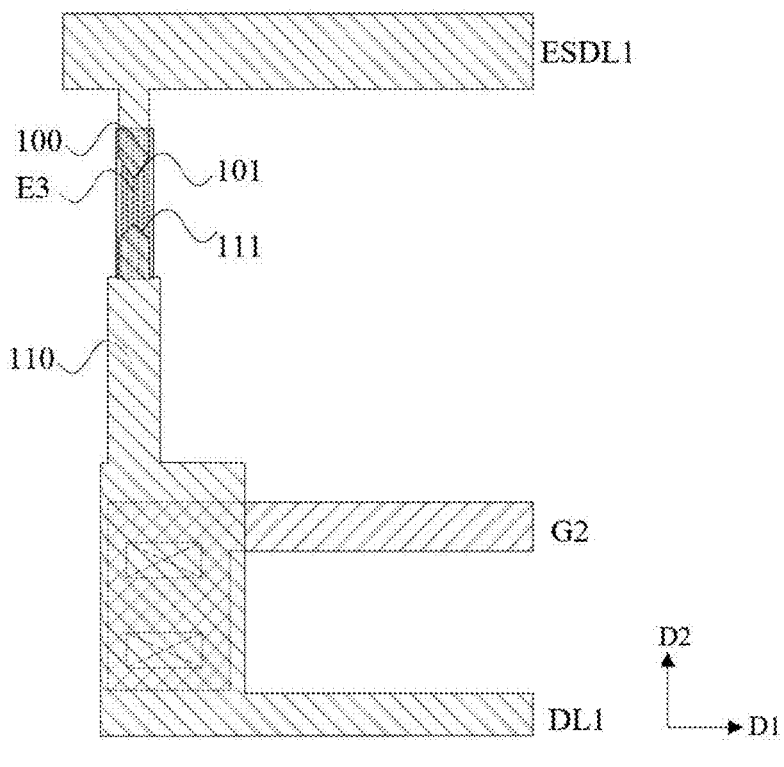
FIG. 19 is an enlarged view of Region C5 in the display panel provided in FIG. 5.
FIG. 20 is an enlarged view of Region C5 in the display panel provided in FIGS. 6 and 8.

In an exemplary embodiment, FIG. 19 is an enlarged view of Region C5 in the display panel provided in FIG. 5. As shown in FIGS. 5 and 19, the first signal connection line DL1 to which the third discharge structure E3 is electrically connected is provided with an eleventh protrusion 110 extending in the second direction D2, the eleventh protrusion 110 is located on a side of the first signal connection line DL1 close to the electrostatic discharge circuit, and the eleventh protrusion 110 includes an eleventh tip 111. A first connection line of the electrostatic discharge line ESDL to which the third discharge structure E3 is electrically connected is provided with a tenth protrusion 100 located on a side of the first connection line ESDL of the electrostatic discharge line close to the electrostatic discharge circuit, and the tenth protrusion 100 includes a tenth tip 101.

In an exemplary embodiment, as shown in FIGS. 5 and 19, an eleventh tip of the first signal connection line DL1 to which the third discharge structure E3 is electrically connected and a tenth tip of the electrostatic discharge line ESDL to which the third discharge structure E3 is electrically connected are disposed opposite to each other.

In an exemplary embodiment, as shown in FIGS. 5 and 19, an orthographic projection of the third discharge structure E3 on the substrate at least partially overlaps with an orthographic projection of the eleventh tip 111 of the electrically connected first signal connection line DL1 on the substrate and an orthographic projection of the tenth tip 101 of the electrically connected electrostatic discharge line ESDL.

Figure 21:
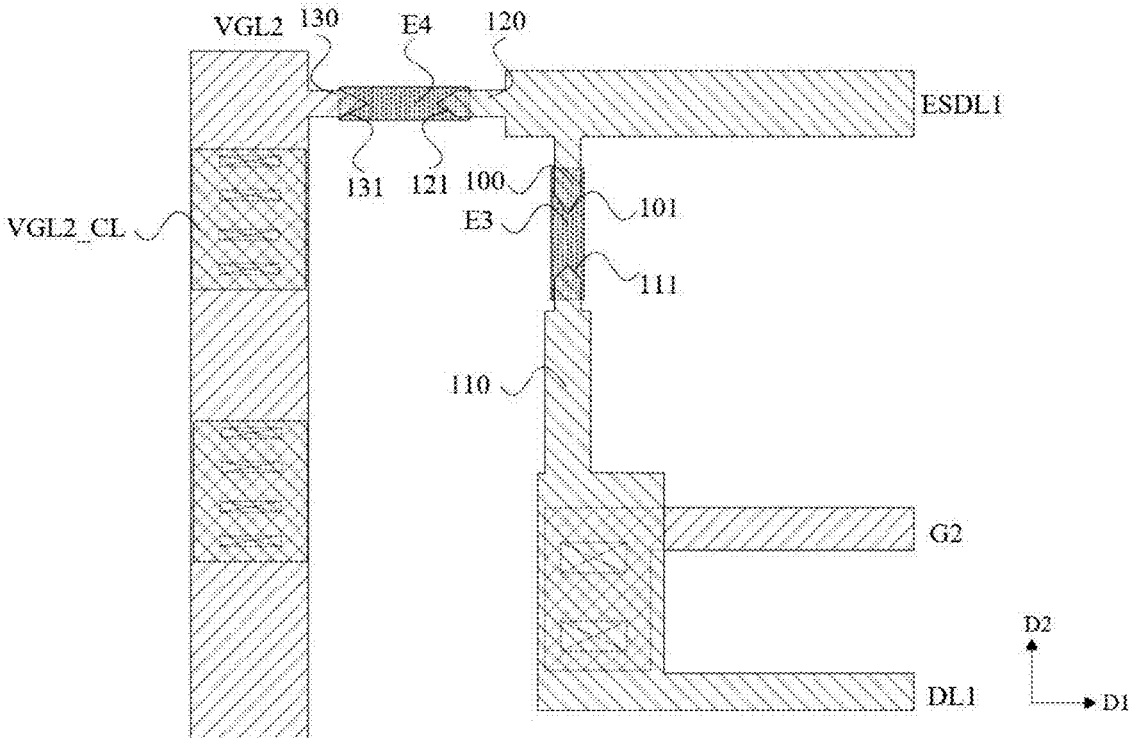
FIG. 21 is an enlarged view of Region C5 in the display panel provided in FIGS. 7 and 9.

In an exemplary embodiment, FIG. 20 is an enlarged view of Region C5 in the display panel provided in FIGS. 6 and 8, and FIG. 21 is an enlarged view of Region C5 in the display panel provided in FIGS. 7 and 9. As shown in FIGS. 20 and 21, the electrostatic discharge line ESDL to which the fourth discharge structure E4 is electrically connected may include a twelfth protrusion 120 located on a side of the first connection line ESDL1 of the electrostatic discharge line ESDL close to the gate drive circuit, and the twelfth protrusion 120 includes a twelfth tip 121. The second low-level power line VGL2 is also provided with a thirteenth protrusion 130 extending along the first direction D1, the thirteenth protrusion 130 is located on a side of the second low-level power line VGL2 close to the display region, and the thirteenth protrusion 130 includes a thirteenth tip 131. FIG. 20 illustrates an example of an orthographic projection of the fourth discharge structure on the substrate partially overlapping an orthographic projection of the ninth tip 91 and the tenth tip 101 on the substrate, and FIG. 21 illustrates an example of an orthographic projection of the fourth discharge structure on the substrate partially overlapping an orthographic projection of the eleventh tip 111 and the tenth tip 101 on the substrate.

In an exemplary embodiment, as shown in FIGS. 20 and 21, a twelfth tip 121 of the electrostatic discharge line ESDL to which the fourth discharge structure E4 is electrically connected is disposed opposite to thirteenth tip 131 of the second low-level power line VGL2.

In an exemplary embodiment, as shown in FIGS. 20 and 21, an orthographic projection of the fourth discharge structure E4 on the substrate at least partially overlaps with an orthographic projection of the twelfth tip 121 of the electrically connected electrostatic discharge line ESDL on the substrate and an orthographic projection of the thirteenth tip 131 of the second low-level power line VGL2 on the substrate.

Figure 22:
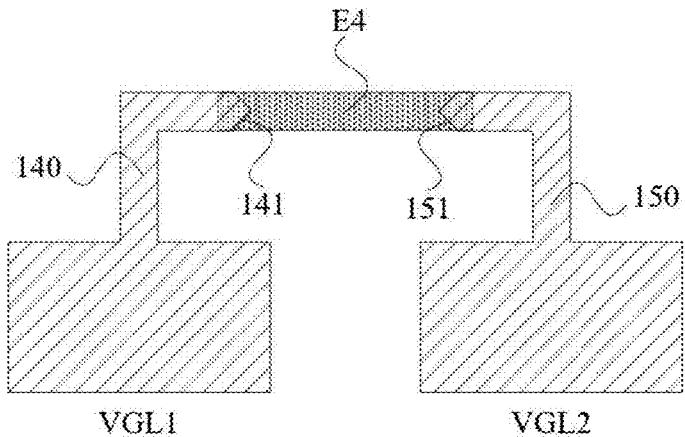
FIG. 22 is an enlarged view of Region C6 in the display panel provided in FIGS. 8 and 9.

In an exemplary embodiment, FIG. 22 is an enlarged view of Region C6 in the display panel provided in FIGS. 8 and 9. As shown in FIGS. 8, 9 and 22, the first low-level power line VGL1 is provided with a fourteenth protrusion 140 located on a side of the first low-level power line VGL1 close to the second power supply wire VSSL, and the fourteenth protrusion 140 includes a fourteenth tip 141. The second low-level power line VGL2 is provided with a fifteenth protrusion 150 located on a side of the second low-level power line VGL2 close to the second power supply wire VSSL, and the fifteenth protrusion 150 includes a fifteenth tip 151.

In an exemplary embodiment, as shown in FIGS. 8, 9, and 22, a fourteenth tip 141 of the first low-level power line VGL1 is disposed opposite to a fifteenth tip 151 of the second low-level power line VGL2.

In an exemplary embodiment, as shown in FIGS. 8, 9 and 22, an orthographic projection of the fifth discharge structure E5 on the substrate at least partially overlaps with an orthographic projection of the fourteenth tip 141 of the first low-level power line VGL1 on the substrate and an orthographic projection of the fifteenth tip 151 of the second low-level power line VGL2 on the substrate.

Figure 23:
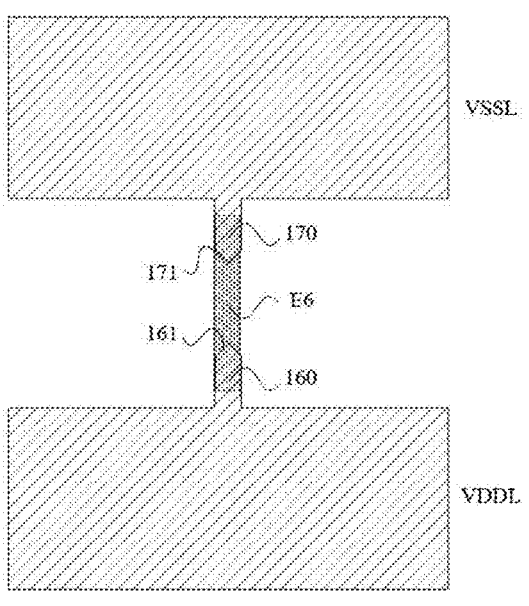
FIG. 23 is an enlarged view of Region C7 in the display panel provided in FIGS. 8 and 9.

In an exemplary embodiment, FIG. 23 is an enlarged view of Region C7 in the display panel provided in FIGS. 8 and 9. As shown in FIGS. 8, 9 and 23, the first power supply wire VDDL is provided with a sixteenth protrusion 160 extending in the second direction D2, the sixteenth protrusion 160 is located on a side of the first power supply wire VDDL close to the second power supply wire VSSL, and the sixteenth protrusion 160 includes a sixteenth tip 161. The second power supply wire VSSL is provided with a seventeenth protrusion 170 extending in the second direction D2, the seventeenth protrusion 170 is located on a side of the second power supply wire VSSL close to the first power supply wire VDDL, and the seventeenth protrusion 170 includes a seventeenth tip 171.

In an exemplary embodiment, as shown in FIGS. 8, 9, and 23, the sixteenth tip 161 of the first power supply wire VDDL is disposed opposite to the seventeenth tip 171 of the second power supply wire VSSL.

In an exemplary embodiment, as shown in FIGS. 8, 9 and 23, an orthographic projection of the sixth discharge structure E6 on the substrate at least partially overlaps with an orthographic projection of the sixteenth tip 161 of the first power supply wire VDDL on the substrate and an orthographic projection of the seventeenth tip 171 of the second power supply wire VSSL on the substrate.

In an exemplary embodiment, the drive circuit layer further includes a plurality of first scan connection portions, a plurality of second scan connection portions, a plurality of data connection portions, a plurality of power connection portions, a plurality of sense signal lines "Sense", a plurality of sense connection portions, and a power connection line VSS_CL. The first scan connection portion is electrically connected to the first scan signal line G1, the second scan connection portion is electrically connected to the second scan signal line G2, the data connection portion is electrically connected to the data signal line "Data", the power connection portion is electrically connected to the first power line VDD, the sense signal line is electrically connected to the pixel circuit and the sense connection portion, and the power connection line VSS-CL is electrically connected to the second power line VSS and the second power supply wire VSSL, respectively.

Figure 24:
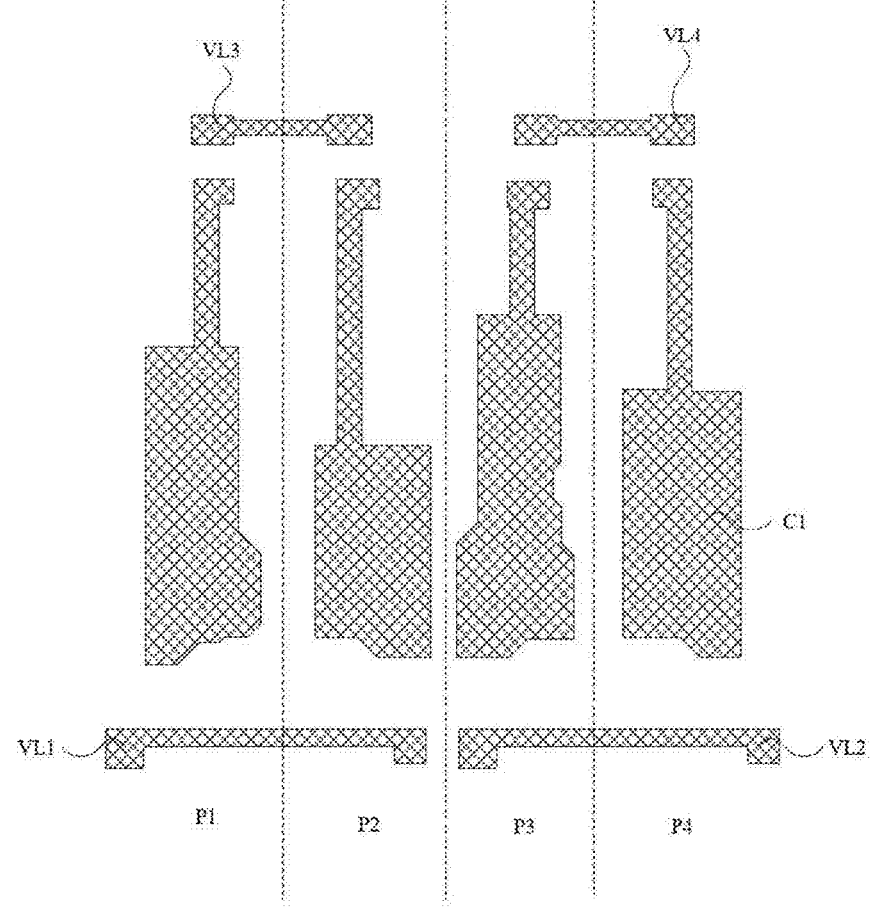
FIG. 24 is a schematic diagram of a pixel circuit in a shield layer.
Figure 25:
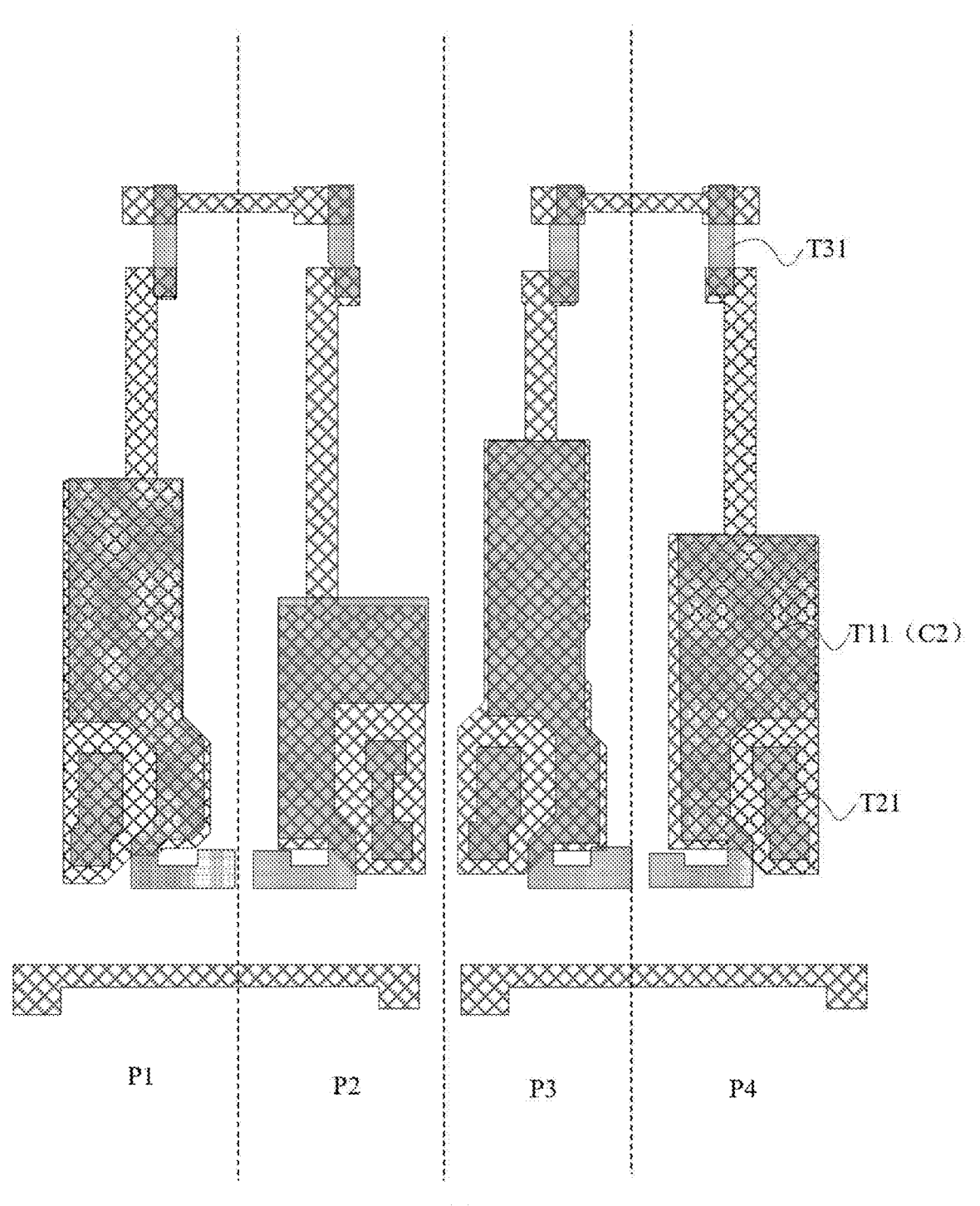
FIG. 25 is a schematic diagram of a pixel circuit after a semiconductor layer is formed.
Figure 26:
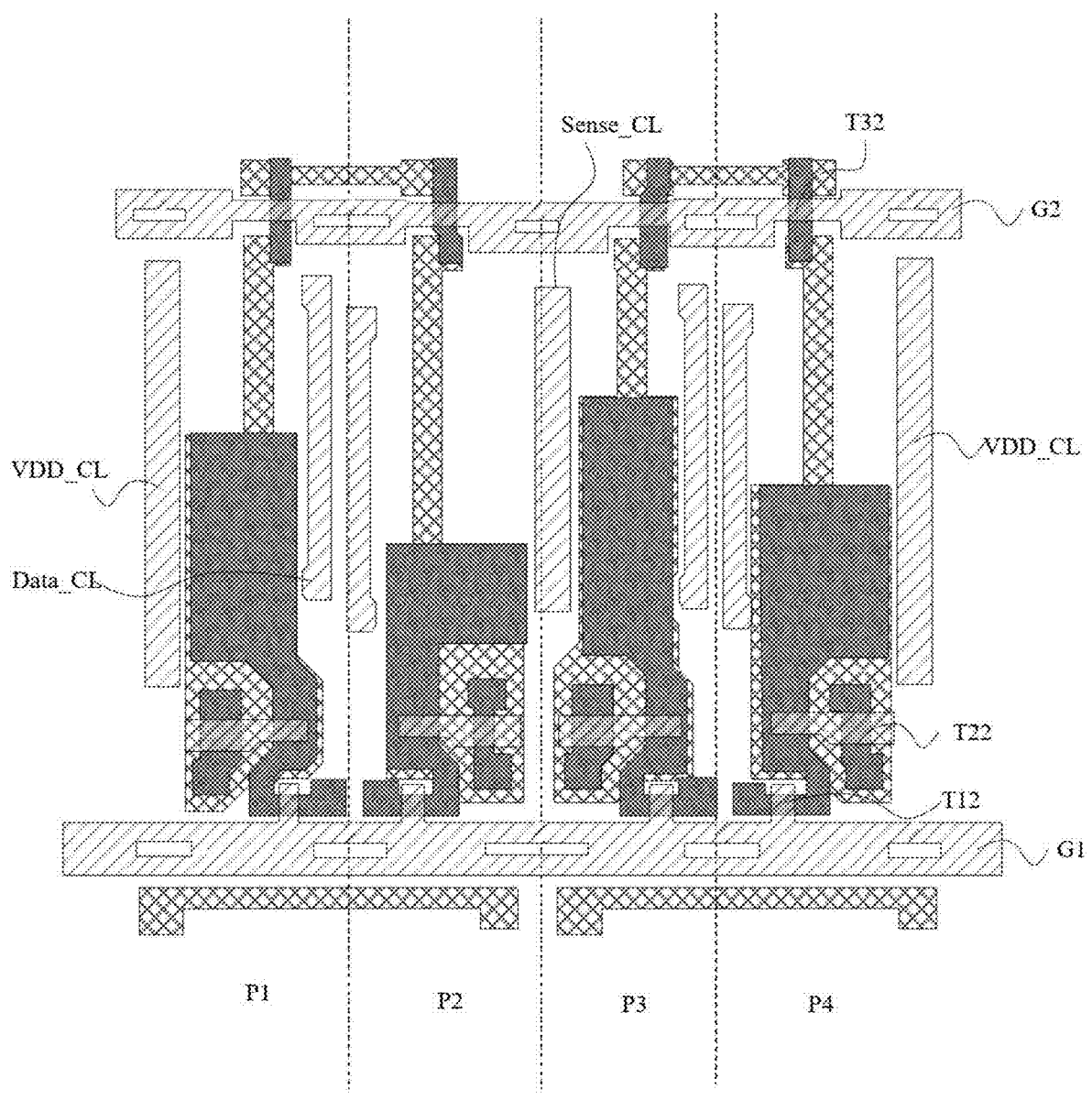
FIG. 26 is a schematic diagram of a pixel circuit after a first conductive layer is formed.
Figure 27:
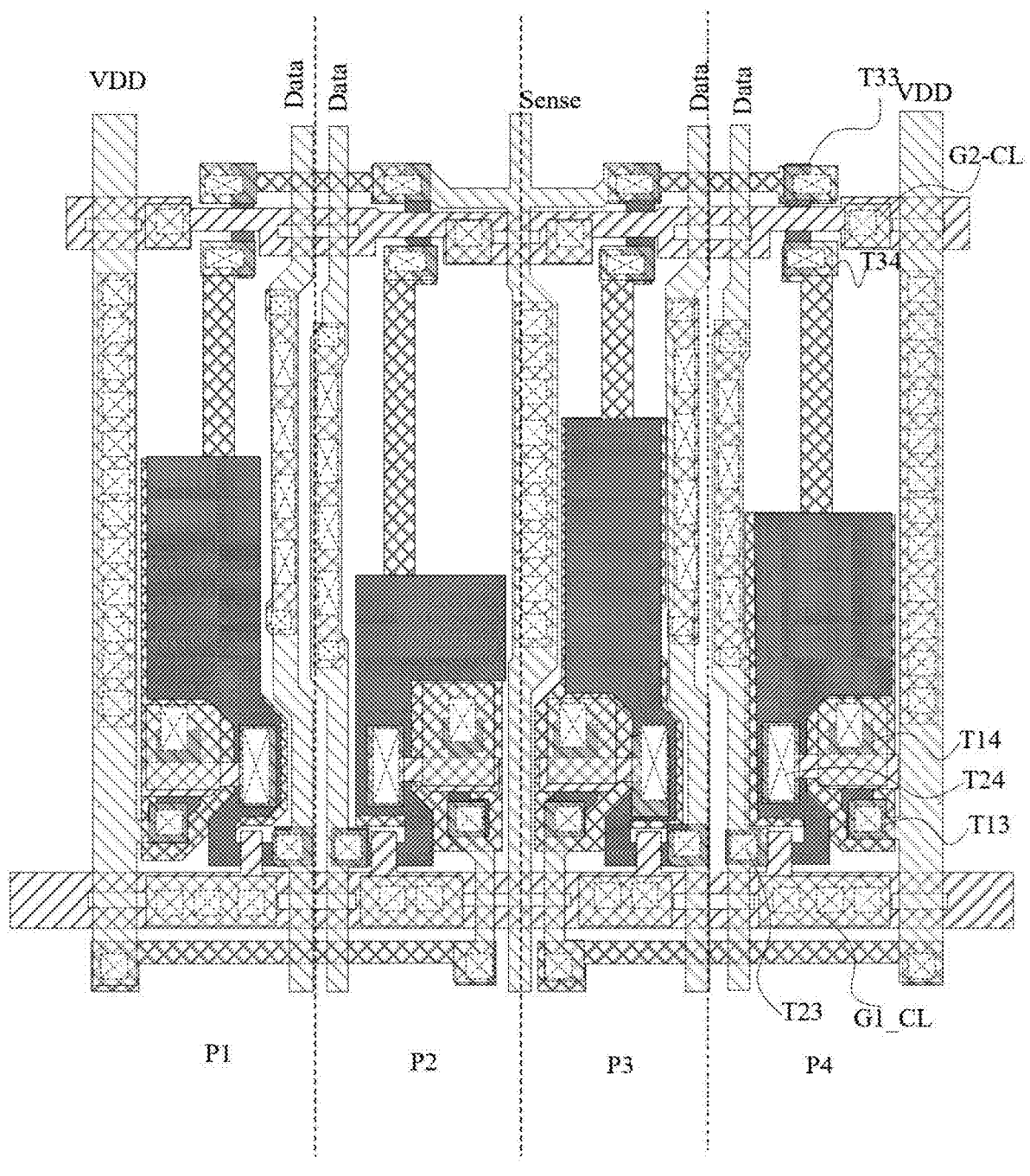
FIG. 27 is a schematic diagram of a pixel circuit after a second conductive layer is formed.
Figure 28:
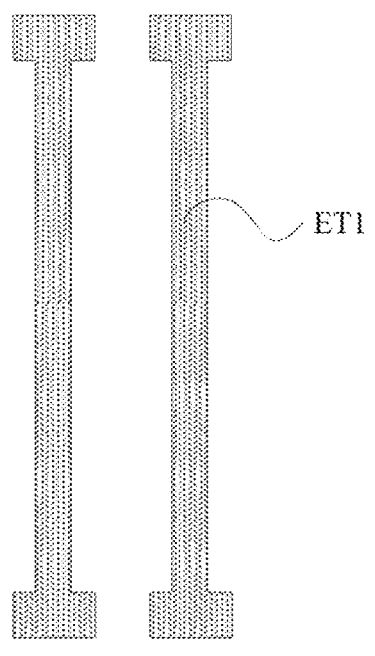
FIG. 28 is a schematic diagram of an electrostatic discharge circuit in a semiconductor layer.

In an exemplary embodiment, as shown in FIGS. 4 to 9, the drive circuit layer may include a shield layer SHD, a semiconductor layer ACT, a first conductive layer Gate, and a second conductive layer SD. FIG. 24 is a schematic diagram of a pixel circuit in a shield layer. FIG. 25 is a schematic diagram of a pixel circuit after a semiconductor layer is formed. FIG. 26 is a schematic diagram of a pixel circuit after a first conductive layer is formed. FIG. 27 is a schematic diagram of a pixel circuit after a second conductive layer is formed. FIG. 28 is a schematic diagram of an electrostatic discharge circuit in a semiconductor layer. FIG.

Figure 29:
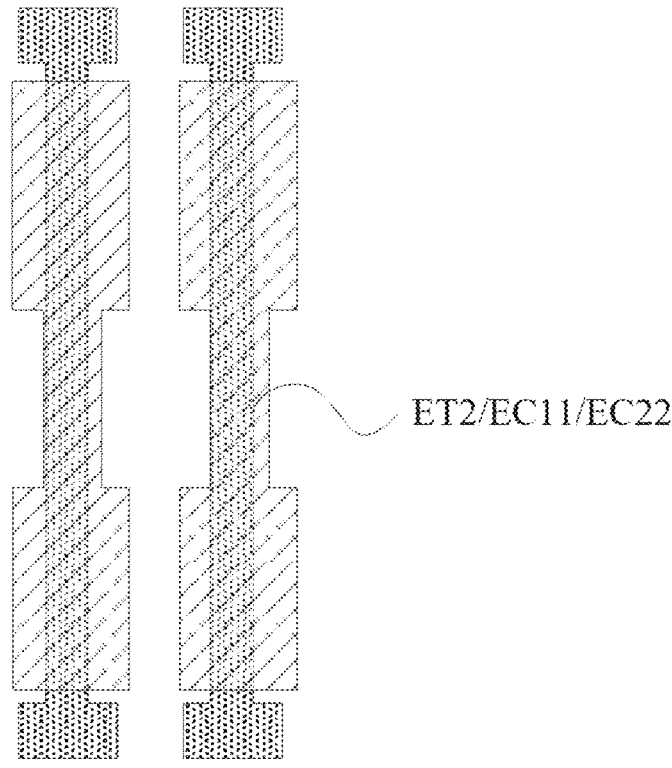
FIG. 29 is a schematic diagram of an electrostatic discharge circuit after a first conductive layer is formed.
Figure 30:
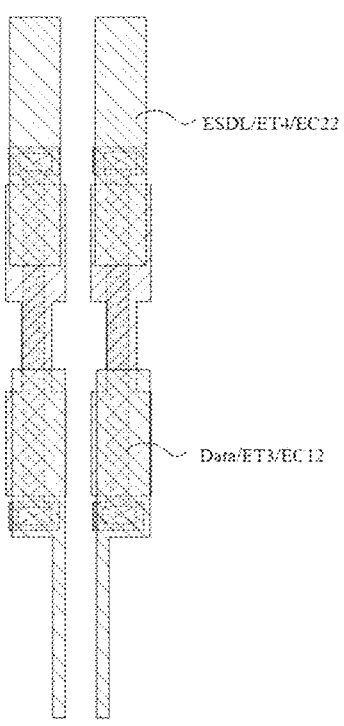
FIG. 30 is a schematic diagram of an electrostatic discharge circuit after a second conductive layer is formed.

29 is a schematic diagram of an electrostatic discharge circuit after a first conductive layer is formed. FIG. 30 is a schematic diagram of an electrostatic discharge circuit after a second conductive layer is formed. FIGS. 24 to 27 are illustrated by examples of four pixel circuits P1 to P4 and FIGS. 28 to 30 are illustrated by examples of two electrostatic discharge circuits.

In an exemplary embodiment, the drive circuit layer may further include a first insulating layer between the shield layer and the semiconductor layer, a second insulating layer between the semiconductor layer and the first conductive layer, a third insulating layer between the first conductive layer and the second conductive layer, and a planarization layer on a side of the second conductive layer away from the substrate.

As shown in FIGS. 4 to 9 and 24 to 30, the shield layer SHD at least includes a second power line VSS, a first electrode plate C1 of the capacitor, and first to fourth connection electrodes VL1 to VL4.

In an exemplary embodiment, the first connection electrode VL1 is configured to be electrically connected to a first power line to which the first pixel circuit and the second pixel circuit are electrically connected, the second connection electrode VL2 is configured to be electrically connected to the first power line to which the third pixel circuit and the fourth pixel circuit are electrically connected, and the third connection electrode VL3 and the fourth connection electrode VL4 are configured to be electrically connected to an sense signal line to which the first pixel circuit to the fourth pixel circuit are electrically connected.

As shown in FIGS. 4 to 9 and FIGS. 24 to 30, the semiconductor layer ACT at least includes one or more of a first discharge structure to a sixth discharge structure E6, an active layer T11 of a first transistor to an active layer T31 of a third transistor, and an active layer ET1 of an electrostatic discharge transistor.

In an exemplary embodiment, the active layer of the first transistor may be multiplexed into a second electrode plate C2 of the capacitor.

As shown in FIGS. 4 to 9 and 24 to 30, the first conductive layer Gate may include at least a first power supply wire VDDL, a second power supply wire VSSL, a first low-level power line VGL1, a second low-level power line VGL2, a first scan signal line G1, a second scan signal line G2, a data connection portion Data_CL, a power connection portion VDD_CL, an inductive connection portion Sense_CL, a control electrode T22 of the second transistor, and a control electrode ET2 of an electrostatic discharge transistor.

In an exemplary embodiment, the data connection portion Data_CL, the power connection portion VDD_CL, and the sense connection portion Sense_CL extend in the second direction.

In an exemplary embodiment, the control electrode ET2 of the electrostatic discharge transistor extends in the second direction.

In an exemplary embodiment, the control electrode ET2 of the electrostatic discharge transistor is multiplexed into a first electrode plate EC11 of a first electrostatic discharge capacitor and a first electrode plate EC21 of a second electrostatic discharge capacitor.

In an exemplary embodiment, a region where the first scan signal line G1 overlaps the active layer of the first transistor is multiplexed into a control electrode T12 of the first transistor, and a region where the second scan signal line G2 overlaps the active layer of the third transistor is multiplexed into a control electrode T32 of the third transistor.

In an exemplary embodiment, the control electrode T22 of the second transistor extends in the first direction.

As shown in FIGS. 4 to 9 and 24 to 30, the second conductive layer SD may at least include a data signal line "Data", a first power line VDD, a first signal connection line DL1, a second signal connection line DL2, an electrostatic discharge line ESDL, a first scan output line OUTL1, a second scan output line OUTL2, a first scan connection portion G1_CL, a second scan connection portion G2_CL, a power connection line VSS_CL, a first low-level connection portion VGL1_CL, a second low-level connection portion VGL2_CL, a second electrode T14 of the first transistor, a second electrode T24 of the second transistor, a first electrode T33 of the third transistor, a second electrode T34 of the third transistor, a first electrode ET3 of the electrostatic discharge transistor, a second electrode ET4 of the electrostatic discharge transistor, a second electrode plate EC12 of the first electrostatic discharge capacitor, and a second electrode plate EC22 of the second electrostatic discharge capacitor.

In an exemplary embodiment, an orthographic projection of the data signal line "Data" on the substrate at least partially overlaps an orthographic projection of the data connection portion Data_CL on the substrate and the data signal line is electrically connected to the data connection portion Data_CL.

In an exemplary embodiment, an orthographic projection of the first power line VDD on the substrate at least partially overlaps with an orthographic projection of the power connection portion VDD_CL on the substrate and the first power line VDD is electrically connected to the power connection portion VDD_CL. In an exemplary embodiment, an orthographic projection of the first power line VDD located on a side of the first pixel circuit away from the second pixel circuit on the substrate partially overlaps an orthographic projection of the first connection electrode on the substrate and the first power line VDD is electrically connected to the first connection electrode. An orthographic projection of the first power line VDD located on a side of the fourth pixel circuit away from the third pixel circuit on the substrate partially overlaps an orthographic projection of the second connection electrode on the substrate and the first power line VDD is electrically connected to the second connection electrode.

In an exemplary embodiment, an orthographic projection of the inductive signal line "Sense" on the substrate at least partially overlaps an orthographic projection of the inductive connection portion Sense_CL, the third connection electrode and the fourth connection electrode on the substrate, and is electrically connected to the inductive connection portion Sense_CL, the third connection electrode and the fourth connection electrode, respectively.

In an exemplary embodiment, the data signal line VDD is multiplexed into a first electrode T23 of the second transistor for the first to fourth pixel circuits.

In an exemplary embodiment, a first power line VDD located on a side of the first pixel circuit away from the second pixel circuit is multiplexed into a first electrode T13 of a first transistor of the first pixel circuit, and a first electrode T13 of a first transistor of a second pixel circuit is electrically connected to the first power line VDD located on a side of the first pixel circuit away from the second pixel circuit through a first connection electrode. A first power line VDD located on a side of the fourth pixel circuit away from the third pixel circuit is multiplexed into a first electrode T13 of a first transistor of the fourth pixel circuit. A first electrode T13 of a first transistor of the third pixel circuit is electrically connected to the first power line VDD located on a side of the fourth pixel circuit away from the third pixel circuit through a second connection electrode.

In an exemplary embodiment, the electrostatic discharge line is reset to a second electrode ET4 of the electrostatic discharge transistor and a second electrode plate EC22 of the second electrostatic discharge capacitor.

In an exemplary embodiment, the data signal line, the first signal connection line, or the second signal connection line are multiplexed into a first electrode ET3 of the electrostatic discharge transistor and a second electrode plate EC12 of the first electrostatic discharge capacitor.

In an exemplary embodiment, a first insulating layer, a second insulating layer and a third insulating layer may be made of any one or more of silicon oxide (SiOx), silicon nitride (SiNx) and silicon oxynitride (SiON), and may be a single layer, multiple layers or a composite layer. The first insulating layer may be called a buffer layer, the second insulating layer may be called a GI layer, and the third insulating layer may be called an interlayer insulating (ILD) layer.

In an exemplary embodiment, the first shield layer, the first conductive layer, and the second conductive layer may be made through a metal material, such as any one or more of Argentum (Ag), Copper (Cu), Aluminum (Al), Titanium (Ti), and Molybdenum (Mo), or an alloy material of the above metals, such as an Aluminum Neodymium alloy (AlNd) or a Molybdenum Niobium alloy (MoNb), and may be of a single-layer structure, or a multi-layer composite structure, such as Ti/Al/Ti. The first planarization layer and the second planarization layer may be made of an organic material, such as resin.

In an exemplary embodiment, the active layer may be made of various materials, such as amorphous indium gallium zinc oxide (α-IGZO), zinc oxynitride (ZnON), indium zinc tin oxide (IZTO), amorphous silicon (α-Si), polycrystalline silicon (p-Si), hexathiophene and polythiophene. That is, the present disclosure is applicable to transistors manufactured based on oxide technology, silicon technology, and organic substance technology.

In an exemplary embodiment, the display panel provided in FIG. 4 may discharge static electricity to the first scan signal line and the second scan signal line by forming a discharge structure with a first discharge structure provided at the semiconductor layer and first and second protrusions provided at the first conductive layer. It is also possible to discharge static electricity to the first scan signal line and the second scan signal line by forming a discharge structure with a second discharge structure provided at the semiconductor layer and a third and fourth protrusions provided at the first conductive layer. It is also possible to discharge static electricity to the static electricity discharge line and the second scan signal line by forming a discharge structure with a third discharge structure provided at the semiconductor layer, a ninth projection provided at the first conductive layer, and a tenth projection provided at the second conductive layer. The display panel provided in FIG. 4 can discharge static electricity to all the first scan signal lines, all the second scan signal lines, the second signal connection line, and the static electricity discharge line.

In an exemplary embodiment, the display panel provided in FIG. 5 may discharge static electricity to the first scan signal line and the second scan signal line by forming a discharge structure with a first discharge structure provided at the semiconductor layer and a first protrusion and a second protrusion provided at the first conductive layer. It is also possible to discharge static electricity to the first scan signal line and the second scan signal line by forming a discharge structure with a second discharge structure provided at the semiconductor layer and a fifth and sixth protrusions provided at the second conductive layer. It is also possible to discharge static electricity to the static electricity discharge line and the first signal connection line by forming a discharge structure with a third discharge structure provided at the semiconductor layer and a tenth and eleventh protrusions provided at the second conductive layer. The display panel provided in FIG. 5 can discharge static electricity to all the first scan signal lines, all the second scan signal lines, the static electricity discharge line, the first signal connection line, and the second signal connection line.

In an exemplary embodiment, the display panel provided in FIG. 6 may discharge static electricity to the first scan signal line and the second scan signal line by forming a discharge structure with a first discharge structure provided at the semiconductor layer and a first and second protrusions provided at the first conductive layer, and may discharge static electricity to the first scan signal line, the second scan signal line and the second low-level power line by forming a discharge structure with the second discharge structure provided at the semiconductor layer and the third, fourth and seventh protrusions provided at the first conductive layer. It is also possible to discharge static electricity to the second scan signal line and the static electricity discharge line by forming a discharge structure with a third discharge structure provided in the semiconductor layer and a ninth protrusion provided in the first conductive layer and a tenth protrusion provided in the second conductive layer. It is also possible to discharge static electricity to the static electricity discharge line and the second low-level power line by forming a discharge structure with a fourth discharge structure provided in the semiconductor layer and a twelfth protrusion provided in the second conductive layer and a thirteenth protrusion provided in the first conductive layer. The display panel provided in FIG. 6 can discharge static electricity to all of the first scan signal lines, all of the second scan signal lines, the static electricity discharge line, the first signal connection line, the second signal connection line, and the second low-level power line.

In an exemplary embodiment, the display panel provided in FIG. 7 may discharge static electricity to the first scan signal line and the second scan signal line by forming a discharge structure with a first discharge structure provided at the semiconductor layer and first and second protrusions provided at the first conductive layer. It is also possible to discharge static electricity to the first scan output line, the second scan output line and the second low-level connection portion by forming a discharge structure with the second discharge structure provided at the semiconductor layer and the third, sixth and eighth protrusions provided at the second conductive layer. It is also possible to discharge static electricity to the second scan signal line and the static electricity discharge line by forming a discharge structure with a third discharge structure provided in the semiconductor layer and an eleventh protrusion and a tenth protrusion provided in the second conductive layer. It is also possible to discharge static electricity to the static electricity discharge line and the second low-level power line by forming a discharge structure with a fourth discharge structure provided in the semiconductor layer and a twelfth protrusion provided in the second conductive layer and a thirteenth protrusion provided in the first conductive layer. The display panel provided in FIG. 7 can discharge static electricity to all the first scan output lines, all the first scan signal lines, all the second scan output lines, all the second scan signal lines, the static electricity discharge line, the first signal connection line, the second signal connection line, the second low-level connection portion, and the second low-level power line.

In an exemplary embodiment, the display panel provided in FIG. 8 may discharge static electricity to the first scan signal line and the second scan signal line by forming a discharge structure with a first discharge structure provided at the semiconductor layer and first and second protrusions provided at the first conductive layer, and may discharge static electricity to the first scan signal line, the second scan signal line and the second low-level power line by forming a discharge structure with the second discharge structure provided at the semiconductor layer and the third, fourth and seventh protrusions provided at the first conductive layer. It is also possible to discharge static electricity to the second scan signal line and the static electricity discharge line by forming a discharge structure with a third discharge structure provided in the semiconductor layer and a ninth protrusion provided in the first conductive layer and a tenth protrusion provided in the second conductive layer. It is also possible to discharge static electricity to the static electricity discharge line and the second low-level power line by forming a discharge structure with a fourth discharge structure provided in the semiconductor layer and a twelfth protrusion provided in the second conductive layer and a thirteenth protrusion provided in the first conductive layer. It is also possible to discharge static electricity to the first low-level power line and the second low-level power line by forming a discharge structure with a fifth discharge structure provided in the semiconductor layer and a fourteenth protrusion and a fifteenth protrusion provided in the first conductive layer. It is also possible to discharge static electricity to the first power supply wire and the second power supply wire by forming a discharge structure with a sixth discharge structure provided in the semiconductor layer and a sixteenth protrusion and a seventeenth protrusion provided in the first conductive layer. The display panel provided in FIG. 8 can discharge static electricity to all first scan signal lines, all second scan signal lines, static electricity discharge line, first signal connection line, second signal connection line, first low-level power line, second low-level power line, first power supply wire and second power supply wire.

In an exemplary embodiment, the display panel provided in FIG. 9 may discharge static electricity to the first scan signal line and the second scan signal line by forming a discharge structure with a first discharge structure provided at the semiconductor layer and first and second protrusions provided at the first conductive layer. It is also possible to discharge static electricity to the first scan output line, the second scan output line and the second low-level connection portion by forming a discharge structure with the second discharge structure provided at the semiconductor layer and the third, sixth and eighth protrusions provided at the second conductive layer. It is also possible to discharge static electricity to the second scan signal line and the static electricity discharge line by forming a discharge structure with a third discharge structure provided in the semiconductor layer and an eleventh protrusion and a tenth protrusion provided in the second conductive layer. It is also possible to discharge static electricity to the static electricity discharge line and the second low-level power line by forming a discharge structure with a fourth discharge structure provided in the semiconductor layer and a twelfth protrusion provided in the second conductive layer and a thirteenth protrusion provided in the first conductive layer. It is also possible to discharge static electricity to the first low-level power line and the second low-level power line by forming a discharge structure with a fifth discharge structure provided in the semiconductor layer and a fourteenth protrusion and a fifteenth protrusion provided in the first conductive layer. It is also possible to discharge static electricity to the first power supply wire and the second power supply wire by forming a discharge structure with a sixth discharge structure provided in the semiconductor layer and a sixteenth protrusion and a seventeenth protrusion provided in the first conductive layer. The display panel provided in FIG. 9 can discharge static electricity to all first scan signal lines, all second scan signal lines, static electricity discharge line, first signal connection line, second signal connection line, first low-level power line, second low-level power line, first power supply wire and second power supply wire.

In an exemplary embodiment, FIG. 5, FIG. 7 and FIG. 9 are discharge structures formed by a second discharge structure provided at a semiconductor layer and a protrusion provided at a second conductive layer. Because the insulating layer between the second conductive layer and the semiconductor layer is thick, the discharge structure is not easy to be penetrated, and the reliability of the display panel is improved.

In an exemplary embodiment, the gate drive circuit may include a plurality of cascaded shift registers. At least one shift register may be electrically connected to at least one first scan output line and at least one second scan output line.

Figure 31:
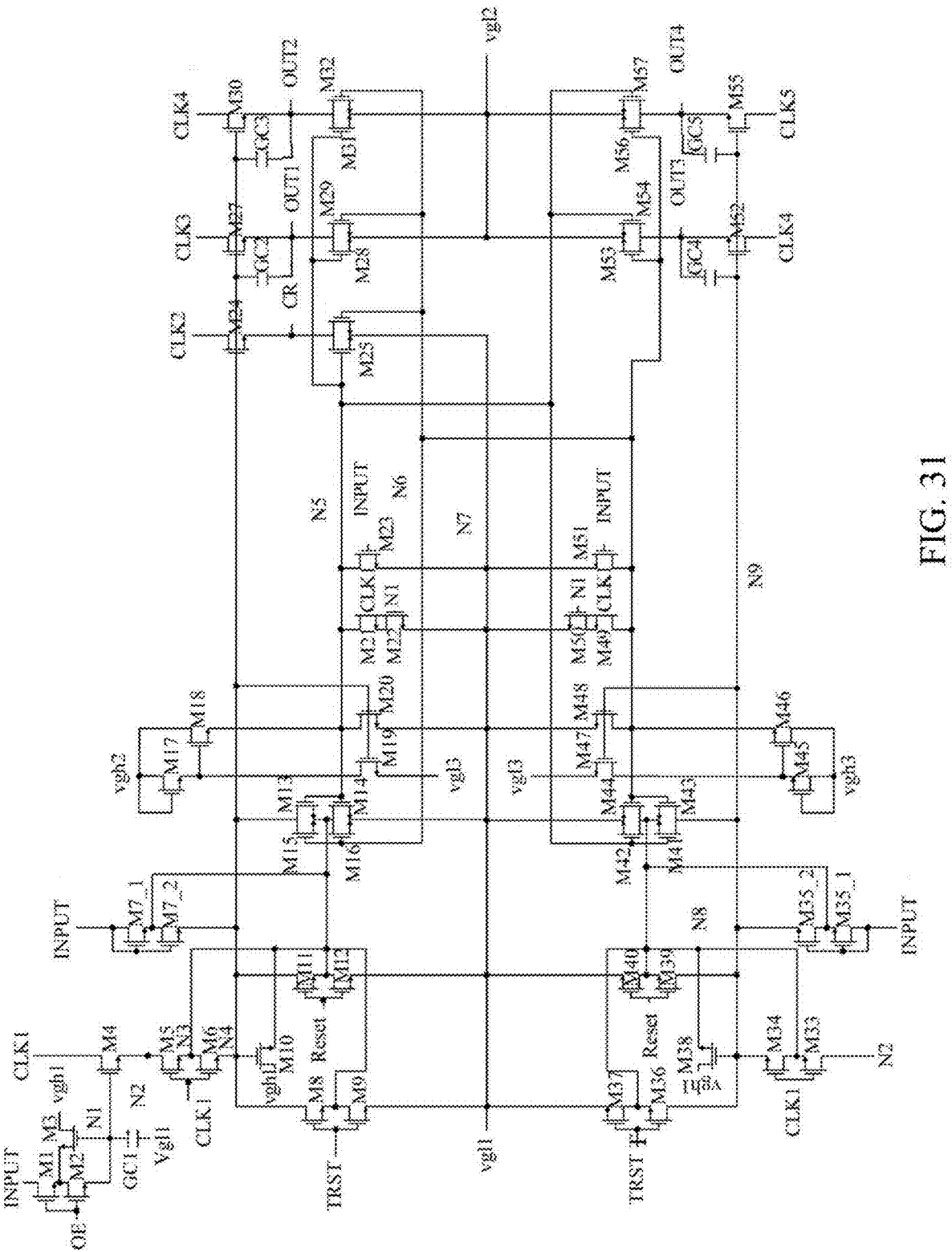
FIG. 31 is an equivalent circuit diagram of an electrostatic discharge circuit.

FIG. 31 is an equivalent circuit diagram of a shift register. As shown in FIG. 31, the shift register may include a first transistor M1 to a fifty-seventh transistor M57 and a first capacitor GC1 to a fifth capacitor GC5. A gate electrode of the first transistor M1 is electrically connected to a random signal terminal OE, a first electrode of the first transistor M1 is electrically connected to the signal input terminal, and a second electrode of the first transistor M1 is electrically connected to a first electrode of the second transistor M2 and a first electrode of the third transistor M3, respectively. A control electrode of the second transistor M2 is electrically connected to the random signal terminal OE, and a second electrode of the second transistor is electrically connected to a first node N1. A control electrode of the third transistor M3 is electrically connected to the first node N1, and a second electrode of the third transistor M3 is electrically connected to the first high-level power terminal vgh1. A control electrode of the fourth transistor M4 is electrically connected to the first node N1, a first electrode of the fourth transistor M4 is electrically connected to a first clock signal terminal CLK1, and second electrode of the fourth transistor M4 is electrically connected to a second node N2. A control electrode of the fifth transistor M5 is electrically connected to the first clock signal terminal CLK1, a first electrode of the fifth transistor M5 is electrically connected to the second node N2, and a second electrode of the fifth transistor M5 is electrically connected to a third node N3. A control electrode of the sixth transistor M6 is electrically connected to the first clock signal terminal CLK1, a first electrode of the sixth transistor M6 is electrically connected to the third node N3, and a second electrode of the sixth transistor M6 is electrically connected to a fourth node N4. A control electrode and a first electrode of the first seventh transistor M7_1 are electrically connected to a signal INPUT terminal INPUT, and a second electrode of the first seventh transistor M7_1 is electrically connected to the third node N3. A control electrode of the second seventh transistor M7_2 is electrically connected to the signal input terminal INPUT, a first electrode of the second seventh transistor M7_2 is electrically connected to the third node N3, and a second electrode of the second seventh transistor M7_2 is electrically connected to the fourth node N4. A control electrode of the eighth transistor M8 is electrically connected to a first reset signal terminal TRST, a first electrode of the eighth transistor M8 is electrically connected to the fourth node N4, and a second electrode of the eighth transistor M8 is electrically connected to the third node N3. A control electrode of the ninth transistor M9 is electrically connected to the first reset signal terminal TRST, a first electrode of the ninth transistor M9 is electrically connected to the third node N3, and a second electrode of the ninth transistor M9 is electrically connected to the first low-level power terminal vgl1. A control electrode of the tenth transistor M10 is electrically connected to the fourth node N4, a first electrode of the tenth transistor M10 is electrically connected to the first high-level power terminal vgh1, and a second electrode of the tenth transistor M10 is electrically connected to the third node N3. A control electrode of the eleventh transistor M11 is electrically connected to a second reset signal terminal Reset, a first electrode of the eleventh transistor M11 is electrically connected to the fourth node N4, and a second electrode of the eleventh transistor M11 is electrically connected to the third node N3. A control electrode of the twelfth transistor M12 is electrically connected to the second reset signal terminal "Reset", a first electrode of the twelfth transistor M12 is electrically connected to the third node N3, and a second electrode of the twelfth transistor M12 is electrically connected to the first low-level power terminal vgl1. A control electrode of the thirteenth transistor M13 is electrically connected to the fifth node N5, a first electrode of the thirteenth transistor M13 is electrically connected to the fourth node N4, and a second electrode of the thirteenth transistor M13 is electrically connected to the third node N3. A control electrode of the fourteenth transistor M14 is electrically connected to a fifth node N5, a first electrode of the fourteenth transistor M14 is electrically connected to the third node N3, and a second electrode of the fourteenth transistor M14 is electrically connected to the first low-level power terminal vgl1. A control electrode of the fifteenth transistor M15 is electrically connected to a sixth node N6, a first electrode of the fifteenth transistor M15 is electrically connected to the fourth node N4, and a second electrode of the fifteenth transistor M15 is electrically connected to the third node N3. A control electrode of the sixteenth transistor M16 is electrically connected to the sixth node N6, a first electrode of the sixteenth transistor M16 is electrically connected to the third node N3, and a second electrode of the sixteenth transistor M16 is electrically connected to the first low-level power terminal vgl1. A control electrode and a first electrode of the seventeenth transistor M17 are electrically connected to a second high-level power terminal vgh2, and a second electrode of the seventeenth transistor M17 is electrically connected to a control electrode of the eighteenth transistor M18. A first electrode of the eighteenth transistor M18 is electrically connected to the second high-level power terminal vgh2, and a second electrode of the eighteenth transistor M18 is electrically connected to the fifth node N5. A control electrode of the nineteenth transistor M19 is electrically connected to the fourth node N4, a first electrode of the nineteenth transistor M19 is electrically connected to the control electrode of the eighteenth transistor M18, and a second electrode of the nineteenth transistor M19 is electrically connected to a third low-level power terminal vgl3. A control electrode of the twentieth transistor M20 is electrically connected to the fourth node N4, a first electrode of the twentieth transistor M20 is electrically connected to the fifth node N5, and a second electrode of the twentieth transistor M20 is electrically connected to a first low-level power terminal vgl. A control electrode of the twenty-first transistor M21 is electrically connected to the first clock signal terminal CLK1, a first electrode of the twenty-first transistor M21 is electrically connected to the fifth node N5, and a second electrode of the twenty-first transistor M21 is electrically connected to a first electrode of the twenty-second transistor M22. A control electrode of the 22nd transistor M22 is electrically connected to the first node N1, a second electrode of the 22nd transistor M22 is electrically connected to the first low-level power terminal vgl1, and a control electrode of the twenty-third transistor M23 is electrically connected to the signal input terminal INPUT, a first electrode of the twenty-third transistor M23 is electrically connected to the fifth node N5, and a second electrode of the twenty-third transistor M23 is electrically connected to the first low-level power terminal vgl. A control electrode of the twenty-fourth transistor M24 is electrically connected to the fourth node N4, a first electrode of the twenty-fourth transistor M24 is electrically connected to a second clock signal terminal CLK2, and a second electrode of the twenty-fourth transistor M24 is electrically connected to a cascaded signal terminal CR. A control electrode of the twenty-fifth transistor M25 is electrically connected to the fifth node N5, a first electrode of the twenty-fifth transistor M25 is electrically connected to the cascaded signal terminal CR, and a second electrode of the twenty-fifth transistor M25 is electrically connected to a seventh node N7. A control electrode of the twenty-sixth transistor M26 is electrically connected to the sixth node N6, a first electrode of the twenty-sixth transistor M26 is electrically connected to the cascaded signal terminal CR, and a second electrode of the twenty-sixth transistor M26 is electrically connected to the seventh node N7. A control electrode of the twenty-seventh transistor M27 is electrically connected to the fourth node N4, a first electrode of the twenty-seventh transistor M27 is electrically connected to the third clock signal terminal CLK3, and a second electrode of the twenty-seventh transistor M27 is electrically connected to a first output terminal OUT1. A control electrode of the twenty-eighth transistor M28 is electrically connected to the fifth node N5, a first electrode of the twenty-eighth transistor M28 is electrically connected to the first output terminal OUT1, and a second electrode of the twenty-eighth transistor M28 is electrically connected to a second low-level power terminal vgl2. A control electrode of the twenty-ninth transistor M29 is electrically connected to the sixth node N6, a first electrode of the twenty-ninth transistor M29 is electrically connected to the first output terminal OUT1, and a second electrode of the twenty-ninth transistor M29 is electrically connected to the second low-level power terminal vgl2. A control electrode of the thirtieth transistor M30 is electrically connected to the fourth node N4, a first electrode of the thirtieth transistor M30 is electrically connected to a fourth clock signal terminal CLK4, and a second electrode of the thirtieth transistor M30 is electrically connected to a second output terminal OUT2. A control electrode of the thirty-first transistor M31 is electrically connected to the fifth node N5, a first electrode of the thirty-first transistor M31 is electrically connected to the second output terminal OUT2, and a second electrode of the thirty-first transistor M31 is electrically connected to the second low-level power terminal vgl2. A control electrode of the thirty-second transistor M32 is electrically connected to the sixth node N6, a first electrode of the thirty-second transistor M32 is electrically connected to the second output terminal OUT2, and a second electrode of the thirty-second transistor M32 is electrically connected to the second low-level power terminal vgl2. A control electrode of the thirty-third transistor M33 is electrically connected to the first clock signal terminal CLK1, a first electrode of the thirty-third transistor M33 is electrically connected to the second node N2, and a second electrode of the thirty-third transistor M33 is electrically connected to an eighth node N8. A control electrode of the thirty-fourth transistor M34 is electrically connected to the first clock signal terminal CLK1, a first electrode of the thirty-fourth transistor M34 is electrically connected to the eighth node N8, and a second electrode of the thirty-fourth transistor M34 is electrically connected to a ninth node N9. A control electrode and a first electrode of the first thirty-fifth transistor M35 are electrically connected to the signal input terminal INPUT, and a second electrode of the first thirty-fifth transistor M35 is electrically connected to the eighth node N8. A control electrode of the second thirty-fifth transistor M35 is electrically connected to the signal input terminal INPUT, a first electrode of the second thirty-fifth transistor M35 is electrically connected to the eighth node N8, and a second electrode of the second thirty-fifth transistor M35 is electrically connected to the ninth node N9. A control electrode of the thirty-sixth transistor M36 is electrically connected to a first reset signal terminal TRST, a first electrode of the thirty-sixth transistor M36 is electrically connected to a tenth node N10, and a second electrode of the thirty-sixth transistor M36 is electrically connected to the eighth node N8. A control electrode of the thirty-seventh transistor M37 is electrically connected to the first reset signal terminal TRST, a first electrode of the thirty-seventh transistor M37 is electrically connected to the eighth node N8, and a second electrode of the thirty-seventh transistor M37 is electrically connected to the first low-level power terminal vgl1. A control electrode of the thirty-eighth transistor M38 is electrically connected to the tenth node N10, a first electrode of the thirty-eighth transistor M38 is electrically connected to the first high-level power terminal vgh1, and a second electrode of the thirty-eighth transistor M38 is electrically connected to the eighth node N8. A control electrode of the thirty-ninth transistor M39 is electrically connected to the second reset signal terminal "Reset", a first electrode of the thirty-ninth transistor M39 is electrically connected to the ninth node N9, and a second electrode of the thirty-ninth transistor M39 is electrically connected to the eighth node N8. A control electrode of the fortieth transistor M40 is electrically connected to the second reset signal terminal "Reset", a first electrode of the fortieth transistor M40 is electrically connected to the eighth node N8, and a second electrode of the fortieth transistor M40 is electrically connected to the first low-level power terminal vgl1. A control electrode of the forty-first transistor M41 is electrically connected to the fifth node N5, a first electrode of the forty-first transistor M41 is electrically connected to the ninth node N9, and a second electrode of the forty-first transistor M41 is electrically connected to the eighth node N8. A control electrode of the forty-second transistor M42 is electrically connected to the fifth node N5, a first electrode of the forty-second transistor M42 is electrically connected to the eighth node N8, and a second electrode of the forty-second transistor M42 is electrically connected to the first low-level power terminal vgl1. A control electrode of the forty-third transistor M43 is electrically connected to the sixth node N6, a first electrode of the forty-third transistor M43 is electrically connected to the ninth node N9, and a second electrode of the forty-third transistor M43 is electrically connected to the eighth node N8. A control electrode of the forty-fourth transistor M44 is electrically connected to the sixth node N6, a first electrode of the forty-fourth transistor M44 is electrically connected to the eighth node N8, and a second electrode of the forty-fourth transistor M44 is electrically connected to the first low-level power terminal vgl1. A control electrode and a first electrode of the forty-fifth transistor M45 are electrically connected to a third high-level power terminal vgh3, and a second electrode of the forty-fifth transistor M45 is electrically connected to a control electrode of the forty-sixth transistor M46. A first electrode of the forty-sixth transistor M46 is electrically connected to the third high-level power terminal vgh3, and a second electrode of the forty-sixth transistor M46 is electrically connected to the sixth node N6. A control electrode of the forty-seventh transistor M47 is electrically connected to the ninth node N9, a first electrode of the forty-seventh transistor M47 is electrically connected to the control electrode of the forty-sixth transistor M46, and a second electrode of the forty-seventh transistor M47 is electrically connected to a third low-level power terminal vgl3. A control electrode of the forty-eighth transistor M48 is electrically connected to the ninth node N9, a first electrode of the forty-eighth transistor M48 is electrically connected to the sixth node N6, and a second electrode of the forty-eighth transistor M48 is electrically connected to the first low-level power terminal vgl. A control electrode of the forty-ninth transistor M49 is electrically connected to the first clock signal terminal CLK1, a first electrode of the forty-ninth transistor M49 is electrically connected to the sixth node N6, and a second electrode of the forty-ninth transistor M49 is electrically connected to a first electrode of the fiftieth transistor M50. A control electrode of the fiftieth transistor M50 is electrically connected to the first node N1, and a second electrode of the fiftieth transistor M50 is electrically connected to the first low-level power terminal vgl. A control electrode of the fifty-first transistor M51 is electrically connected to the signal input terminal INPUT, a first electrode of the fifty-first transistor M51 is electrically connected to the sixth node N6, and a second electrode of the fifty-first transistor M51 is electrically connected to the first low-level power terminal vgl. A control electrode of the fifty-second transistor M52 is electrically connected to the ninth node N9, a first electrode of the fifty-second transistor M52 is electrically connected to a fourth clock signal terminal CLK4, and a second electrode of the fifty-second transistor M52 is electrically connected to a third output terminal OUT3. A control electrode of the fifty-third transistor M53 is electrically connected to the sixth node N6, a first electrode of the fifty-third transistor M53 is electrically connected to the third output terminal OUT3, and a second electrode of the fifty-third transistor M53 is electrically connected to the second low-level power terminal vgl2. A control electrode of the fifty-fourth transistor M54 is electrically connected to the fifth node N5, a first electrode of the fifty-fourth transistor M54 is electrically connected to the third output terminal OUT3, and a second electrode of the fifty-fourth transistor M54 is electrically connected to the second low-level power terminal vgl2. A control electrode of the fifty-fifth transistor M55 is electrically connected to the ninth node N9, a first electrode of the fifty-fifth transistor M55 is electrically connected to a fifth clock signal terminal CLK5, and a second electrode of the fifty-fifth transistor M55 is electrically connected to a fourth output terminal OUT4. A control electrode of the fifty-sixth transistor M56 is electrically connected to the sixth node N6, a first electrode of the fifty-sixth transistor M56 is electrically connected to the fourth output terminal OUT4, and a second electrode of the fifty-sixth transistor M56 is electrically connected to the second low-level power terminal vgl2. A control electrode of the fifty-seventh transistor M57 is electrically connected to the fifth node N5, a first electrode of the fifty-seventh transistor M57 is electrically connected to the fourth output terminal OUT4, and a second electrode of the fifty-seventh transistor M57 is electrically connected to the second low-level power terminal vgl2. A terminal of the first capacitor GC1 is electrically connected to the first node N1, and a terminal of the first capacitor GC1 is electrically connected to the first low-level power terminal. A terminal of the second capacitor GC2 is electrically connected to the fourth node N4, and the other terminal of the second capacitor GC2 is electrically connected to the first output terminal OUT1. A terminal of the third capacitor GC32 is electrically connected to the fourth node N4, and the other terminal of the third capacitor GC3 is electrically connected to the second output terminal OUT2. A terminal of the fourth capacitor GC4 is electrically connected to the ninth node N9, and the other terminal of the fourth capacitor GC4 is electrically connected to the third output terminal OUT3. A terminal of the fifth capacitor GC5 is electrically connected to the ninth node N9, and the other terminal of the fifth capacitor GC5 is electrically connected to the fourth output terminal OUT4.

In an exemplary embodiment, the signal input terminal INPUT of the N-stage shift register is electrically connected to the cascaded signal terminal of the N−4-stage shift register. The second reset signal terminal "Reset" of the N-stage shift register is electrically connected to the cascaded signal terminal of the N+8-stage shift register. A first output terminal and a third output terminal of the N-stage shift register are electrically connected to two first scan outputs. A second output terminal and a fourth output terminal of the N-stage shift register are electrically connected to two second scan outputs. The first low-level power terminal of each stage shift register is electrically connected to the first low-level power line through the first low-level connection portion, and the second low-level power terminal of each stage shift register is electrically connected to the second low-level power line through the second low-level connection portion.

An embodiment of the present disclosure further provides a display apparatus, including a display panel described above.

The display panel is the display panel in accordance with any one of the preceding embodiments, and their implementation principles and implementation effects are similar, and will not be repeated herein.

In an exemplary example, the display apparatus may be a liquid crystal display (LCD) or an organic light emitting diode (OLED) display apparatus. The display apparatus may be any product or component with a display function, such as a liquid crystal panel, electronic paper, an OLED panel, an active-matrix organic light emitting diode (AMOLED) panel, a mobile phone, a tablet computer, a television, a display, a notebook computer, a digital photo frame or a navigator.

The drawings of the embodiments of the present disclosure only involve structures involved in the embodiments of the present disclosure, and other structures may refer to usual designs.

For the sake of clarity, the thickness and size of a layer or a micro structure is enlarged in the accompanying drawings used to describe the embodiments of the present disclosure. It can be understood that when an element such as a layer, film, region or substrate is described as being "on" or "under" another element, this element may be "directly" located "on" or "under" the another element, or an intermediate element may exist.

Although the implementations disclosed in the present disclosure are as above, the described contents are only implementations used for convenience of understanding the present disclosure and are not intended to limit the present disclosure. Any skilled person in the art to which the present invention pertains can make any modifications and alterations in forms and details of implementations without departing from the spirit and scope of the present disclosure. However, the patent protection scope of the present disclosure should be subject to the scope defined by the appended claims.

The invention claimed is:

1. A display panel, comprising: a substrate and a drive circuit layer disposed on the substrate, wherein:

the substrate comprises: a display region and a non-display region, the drive circuit layer comprises: pixel circuits located in the display region and arranged in an array, and a plurality of first scan signal lines and a plurality of second scan signal lines located at least partially in the display region, at least one pixel circuit is electrically connected to at least one first scan signal line of the plurality of first scan signal lines and at least one second scan signal line of the plurality of second scan signal lines respectively, the first scan signal line and the second scan signal line electrically connected to the pixel circuit are respectively located on both sides of the pixel circuit and extended at least partially in a first direction; and the drive circuit layer comprises a plurality of first discharge structures and/or a plurality of second discharge structures, at least one first discharge structure of the plurality of first discharge structures is electrically connected to the first scan signal line and the second scan signal line respectively, the first scan signal line and the second scan signal line electrically connected to the first discharge structure are connected to a same row of pixel circuits, at least one second discharge structure of the plurality of second discharge structures is electrically connected to the first scan signal line and the second scan signal line respectively, the first scan signal line and the second scan signal line electrically connected to the second discharge structure are connected to adjacent row of pixel circuits and are located between the adjacent row of pixel circuits.

2. The display panel according to claim 1, wherein:

the drive circuit layer further comprises: a gate drive circuit located in a non-display region, a first low-level power line and a second low-level power line extending along a second direction, and a plurality of first scan output lines and a plurality of second scan output lines extending at least partially along the first direction, the first direction is intersected with the second direction, the first low-level power line and the second low-level power line are disposed on a same layer, the first scan output lines and the second scan output lines are disposed on a same layer, the first low-level power line is located on a side of a first scan output line close to the substrate;

the first scan output line is electrically connected to the first scan signal line, a second scan output line is electrically connected to the second scan signal line, and the gate drive circuit is electrically connected to the first low-level power line, the second low-level power line, a plurality of first scan output lines and a plurality of second scan output lines, respectively; and the first low-level power line and the second low-level power line are located on a side of the gate drive circuit close to the display region, and the first low-level power line is located on a side of the second low-level power line away from the display region.

3. The display panel according to claim 2, wherein:

the drive circuit layer further comprises: a plurality of data signal lines at least partially located in the display region, and a plurality of electrostatic discharge circuits and a plurality of electrostatic discharge lines located in the non-display region, the data signal lines and the electrostatic discharge lines at least partially extend in a second direction, and the data signal lines and the electrostatic discharge lines are disposed in a same layer as the electrostatic discharge lines; and the pixel circuits are electrically connected to the data signal lines, and at least one electrostatic discharge circuit is electrically connected to a data signal line and an electrostatic discharge line, respectively.

4. The display panel according to claim 3, wherein:

the drive circuit layer further comprises: a first power line located at least partially in the display region, and a first power supply wire located in the non-display region, a second power line and a second power supply wire, the first power supply wire supplies a high-level signal, and the second power supply wire supplies a low-level signal;

the first power supply wire and the second power supply wire are disposed in a same layer, the first power line is located on a side of the first power supply wire away from the substrate, the second power line is located on a side of the second power supply wire close to the substrate, the first power supply wire is located on a side of the second power line away from the display region, and the second power line partially surrounds the first power supply wire, the second power supply wire is disposed on a side of the first power supply wire away from the display region and surrounds at least one side of the display region; and the pixel circuit is electrically connected to the first power line, an orthographic projection of the first power supply wire on the substrate is partially overlapped with orthographic projection portions of the first power line and the second power line on the substrate, and the first power supply wire is electrically connected to the first power line, an orthographic projection of the second power line on the substrate is partially overlapped with orthographic projections of the plurality of electrostatic discharge lines and the first power line on the substrate, and the second power line is electrically connected to the plurality of electrostatic discharge lines and the second power supply wire, respectively.

5. The display panel according to claim 4, wherein:

the drive circuit layer further comprises: a first signal connection line and a second signal connection line, the first signal connection line and the second signal connection line are at least partially extended in the first direction, and the first signal connection line and the second signal connection line are electrically connected to different electrostatic discharge circuits, respectively;

the pixel circuit comprises a first pixel circuit and a second pixel circuit, wherein the second pixel circuit is located on a side of the first pixel circuit close to a second power supply wire;

an orthographic projection of the first scan signal line electrically connected to the first pixel circuit on the substrate is partially overlapped with an orthographic projection of the first scan output line on the substrate, and the first scan signal line is electrically connected to the first scan output line, and an orthographic projection of the second scan signal line electrically connected to the first pixel circuit on the substrate is partially overlapped with an orthographic projection of the second scan output line on the substrate, and the second scan signal line is electrically connected to the second scan output line; and an orthographic projection of the second scan signal line electrically connected to the second pixel circuit on the substrate is partially overlapped with an orthographic projection of the first signal connection line on the substrate and the second scan signal line is electrically connected to the first signal connection line, and an orthographic projection of the first scan signal line electrically connected to the second pixel circuit on the substrate is partially overlapped with an orthographic projection of the second signal connection line on the substrate, and the first scan signal line is electrically connected to the second signal connection line.

6. The display panel according to claim 5, wherein the drive circuit layer further comprises a plurality of first low-level connection portions arranged at intervals and a plurality of second low-level connection portions arranged at intervals, the first low-level connection portions and the second low-level connection portions are disposed in a same layer, and the first low-level connection portions are located on a side of the first low-level power line away from the substrate.

7. The display panel according to claim 6, wherein:

when the display panel comprises the first discharge structure, the first scan signal line is provided with a first protrusion extending in the second direction, the first protrusion is located on a side of the first scan signal line close to an electrically connected pixel circuit, and the first protrusion comprises a first tip;

the second scan signal line is provided with a second protrusion extending in the second direction, the second protrusion is located on a side of the second scan signal line close to an electrically connected pixel circuit, and the second protrusion comprises a second tip; and the first tip of the first scan signal line electrically connected to the first discharge structure is disposed opposite to the second tip of the second scan signal line electrically connected to the first discharge structure, and an orthographic projection of the first discharge structure on the substrate is at least partially overlapped with an orthographic projection of the first tip of the first scan signal line electrically connected to the first discharge structure on the substrate and an orthographic projection of the second tip of the second scan signal line electrically connected to the first discharge structure on the substrate, respectively.

8. The display panel according to claim 6, wherein:

when the display panel comprises the second discharge structure, the first scan signal line is provided with a third protrusion extending at least partially in a second direction, the third protrusion is located on a side of the first scan signal line close to the gate drive circuit, and the third protrusion comprises a third tip;

the second scan signal line is further provided with a fourth protrusion extending at least partially in the second direction, the fourth protrusion is located on a side of the second scan signal line close to the gate drive circuit, and the fourth protrusion comprises a fourth tip; and the third tip of the first scan signal line electrically connected to the second discharge structure is disposed opposite to the fourth tip of the second scan signal line electrically connected to the second discharge structure, and an orthographic projection of the second discharge structure on the substrate is at least partially overlapped with an orthographic projection of the third tip of the electrically connected first scan signal line on the substrate and an orthographic projection of the fourth tip of the electrically connected second scan signal line on the substrate, respectively.

9. The display panel according to claim 8, wherein the second discharge structure is electrically connected to the second low-level power line or a second low-level connection portion.

10. The display panel according to claim 9, wherein:

when the second discharge structure is electrically connected to the second low-level power line, the second low-level power line is provided with a seventh protrusion extending in the first direction, and the seventh protrusion comprises a seventh tip;

a dummy line passing through the seventh tip and extending in the first direction is located between the other two tips at least partially overlapping the second discharge structure on the substrate; and an orthographic projection of the second discharge structure on the substrate is partially overlapped with an orthographic projection of the seventh tip of the electrically connected second low-level power line on the substrate.

11. The display panel according to claim 9, wherein:

when the second discharge structure is electrically connected to a second low-level connection portion, the second low-level connection portion is provided with an eighth protrusion extending in the first direction, and the eighth protrusion portion comprises an eighth tip;

a dummy line passing through the eighth tip and extending in the first direction is located between other two tips at least partially overlapping the second discharge structure on the substrate; and an orthographic projection of the second discharge structure on the substrate is partially overlapped with an orthographic projection of the eighth tip of the electrically connected second low-level connection portion on the substrate.

12. The display panel according to claim 6, wherein:

when the display panel comprises a second discharge structure, the second discharge structure is electrically connected to the first scan signal line through a first signal line, and is electrically connected to the second scan signal line through a second scan output line; and the first signal line comprises a first scan output line or a second signal connection line, when the pixel circuit electrically connected to the first scan signal line is a first pixel circuit, the first signal line is the first scan output line, and when the pixel circuit electrically connected to the first scan signal line is a second pixel circuit, the first signal line is the second signal connection line.

13. The display panel according to claim 12, wherein:

the first signal line electrically connected to the second discharge structure is provided with a fifth protrusion extending at least partially in the second direction, the fifth protrusion is located on a side of the first signal line close to the gate drive circuit, and the fifth protrusion comprises a fifth tip;

the second scan output line electrically connected to the second scan signal line is provided with a sixth protrusion extending at least partially in the second direction, the sixth protrusion is located on a side of the second scan output line close to the gate drive circuit, and the sixth protrusion comprises a sixth tip; and the fifth tip of the first signal line electrically connected to the second discharge structure is disposed opposite to the sixth tip of the second scan output line electrically connected to the second discharge structure, and an orthographic projection of the second discharge structure on the substrate is at least partially overlapped with an orthographic projection of the fifth tip of the electrically connected first signal line on the substrate and an orthographic projection of the sixth tip of the electrically connected second scan output line on the substrate, respectively.

14. The display panel according to claim 6, wherein:

the drive circuit layer further comprises: at least one of a third discharge structure, a fourth discharge structure, a fifth discharge structure, and a sixth discharge structure; and the third discharge structure is electrically connected to a scan signal line close to a non-display region and an electrostatic discharge line close to the gate drive circuit, respectively, the fourth discharge structure is electrically connected to a second low-level power line and an electrostatic discharge line close to the gate drive circuit, respectively, the fifth discharge structure is electrically connected to a first low-level power line and a second low-level power line, respectively, and the sixth discharge structure is electrically connected to a first power supply wire and a second power supply wire, respectively, and the scan signal line is the first scan signal line or the second scan signal line.

15. The display panel according to claim 14, wherein the first discharge structure, the second discharge structure, the third discharge structure, the fourth discharge structure, the fifth discharge structure, and the sixth discharge structure are disposed on a same layer.

16. The display panel according to claim 14, wherein when the drive circuit layer comprises a third discharge structure or a fourth discharge structure, the electrostatic discharge line close to the gate drive circuit comprises a first connection line extending in the first direction and a second connection line extending in the second direction, and the first connection line is electrically connected to the second connection line.

17. The display panel according to claim 16, wherein:

the scan signal line electrically connected to the third discharge structure is provided with a ninth protrusion extending in the second direction, the ninth protrusion is located on a side of the scan signal line close to the electrostatic discharge circuit, and the ninth protrusion comprises a ninth tip;

the first connection line of the electrostatic discharge line electrically connected to the third discharge structure is provided with a tenth protrusion, the tenth protrusion is located on a side of the first connection line close to the electrostatic discharge circuit, and the tenth protrusion comprises a tenth tip;

the ninth tip of the scan signal line electrically connected to the third discharge structure and the tenth tip of the electrostatic discharge line electrically connected to the third discharge structure are disposed opposite to each other; and an orthographic projection of the third discharge structure on the substrate is at least partially overlapped with an orthographic projection of the ninth tip of the electrically connected scan signal line and the tenth tip of the electrostatic discharge line electrically connected to the third discharge structure on the substrate.

18. The display panel according to claim 16, wherein the third discharge structure is electrically connected to the scan signal line through the first signal connection line.

19. The display panel according to claim 18, wherein:

the first signal connection line electrically connected to the third discharge structure is provided with an eleventh protrusion extending in the second direction, the eleventh protrusion is located on a side of the first signal connection line close to the electrostatic discharge circuit, and the eleventh protrusion comprises an eleventh tip;

the first connection line of the electrostatic discharge line electrically connected to the third discharge structure is provided with a tenth protrusion, the tenth protrusion is located on a side of the first connection line of the electrostatic discharge line close to the electrostatic discharge circuit, and the tenth protrusion comprises a tenth tip;

the eleventh tip of the first signal connection line electrically connected to the third discharge structure and the tenth tip of the electrostatic discharge line electrically connected to the third discharge structure are disposed opposite to each other; and an orthographic projection of the third discharge structure on the substrate is at least partially overlapped with an orthographic projection of the eleventh tip of the electrically connected first signal connection line and the tenth tip of the electrically connected electrostatic discharge line on the substrate.

20. A display apparatus, comprising: the display panel of claim 1.

* * * * *